(12) United States Patent
Orii et al.

(10) Patent No.: US 7,404,407 B2
(45) Date of Patent: Jul. 29, 2008

(54) SUBSTRATE PROCESSING APPARATUS

(75) Inventors: Takehiko Orii, Nirasaki (JP); Osamu Kuroda, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 11/616,075

(22) Filed: Dec. 26, 2006

(65) Prior Publication Data

US 2007/0105379 A1 May 10, 2007

Related U.S. Application Data

(62) Division of application No. 10/195,453, filed on Jul. 16, 2002, now Pat. No. 7,171,973.

(30) Foreign Application Priority Data

Jul. 16, 2001 (JP) ............................. 2001-215479
Jul. 16, 2001 (JP) ............................. 2001-215505

(51) Int. Cl.
*B08B 3/02* (2006.01)
(52) U.S. Cl. ...................... 134/94.1; 134/148; 134/153; 134/200; 134/901
(58) Field of Classification Search ................. 134/200, 134/902
See application file for complete search history.

(56) References Cited

U.S. PATENT DOCUMENTS

| | | | |
|---|---|---|---|
| 3,953,265 A | 4/1976 | Hood | |
| 4,021,278 A | 5/1977 | Hood et al. | |
| 4,339,297 A | 7/1982 | Aigo | |
| 4,350,562 A | 9/1982 | Bonu | |
| 4,485,758 A | 12/1984 | Peugh et al. | |
| 4,544,446 A | 10/1985 | Cady | |
| 4,718,975 A | 1/1988 | Bowling et al. | |
| 5,209,180 A | 5/1993 | Shoda et al. | |
| 5,395,482 A * | 3/1995 | Onda et al. | ................... 216/73 |
| 5,395,649 A | 3/1995 | Ikeda | |
| 5,472,502 A | 12/1995 | Bachelder | |
| 5,693,149 A * | 12/1997 | Passer et al. | ................. 134/26 |
| 5,715,612 A * | 2/1998 | Schwenkler | ................ 34/470 |
| 5,762,708 A | 6/1998 | Motoda et al. | |
| 5,927,303 A | 7/1999 | Miya et al. | |
| 5,975,097 A | 11/1999 | Yonemizu et al. | |
| 5,979,475 A | 11/1999 | Satoh et al. | |
| 6,013,316 A | 1/2000 | Cubit | |
| 6,059,891 A | 5/2000 | Kubota et al. | |

(Continued)

FOREIGN PATENT DOCUMENTS

JP 61-152020 * 7/1986

(Continued)

*Primary Examiner*—Frankie L Stinson
(74) *Attorney, Agent, or Firm*—Smith, Gambrell & Russell, LLP

(57) ABSTRACT

The substrate processing apparatus has an enclosure structure enclosing a substrate support member to define a processing space. The enclosure structure has an opening closed by a shutter. A processing fluid supply unit, which supplies processing fluid, such as chemical liquid, is accommodated in a housing. The processing fluid supply unit accommodated in the housing is advanced into the processing space through the opening of the enclosure structure to feed the processing fluid onto the substrate supported by the substrate support member.

4 Claims, 15 Drawing Sheets

U.S. PATENT DOCUMENTS

| | | | |
|---|---|---|---|
| 6,090,205 | A | 7/2000 | Sakai et al. |
| 6,273,104 | B1 | 8/2001 | Shibara et al. |
| 6,431,190 | B1 | 8/2002 | Oka et al. |
| 6,446,643 | B2 | 9/2002 | Curtis et al. |
| 6,497,241 | B1 | 12/2002 | Pascal |
| 6,588,437 | B1 | 7/2003 | Higashi |
| 6,601,596 | B2 | 8/2003 | Liang et al. |
| 6,629,539 | B1 * | 10/2003 | Yanagita et al. ............... 134/78 |
| 7,000,623 | B2 * | 2/2006 | Welsh et al. ............... 134/95.1 |

FOREIGN PATENT DOCUMENTS

| | | |
|---|---|---|
| JP | 8-78368 | 3/1996 |

* cited by examiner

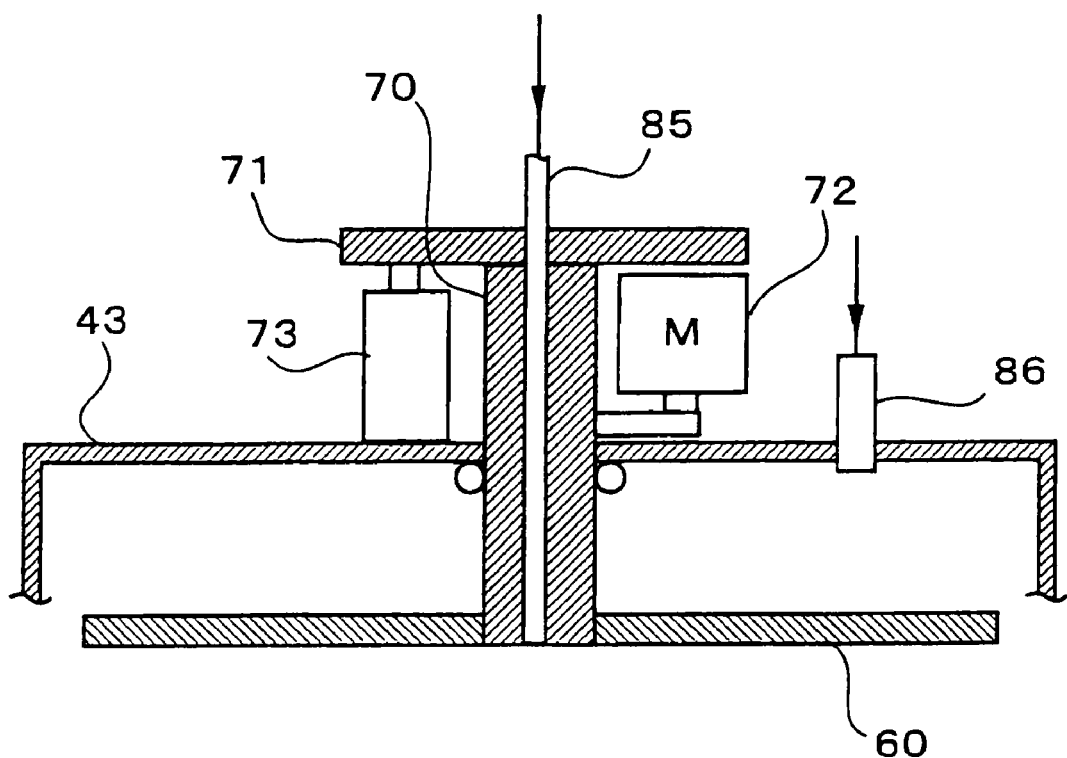
F I G. 8
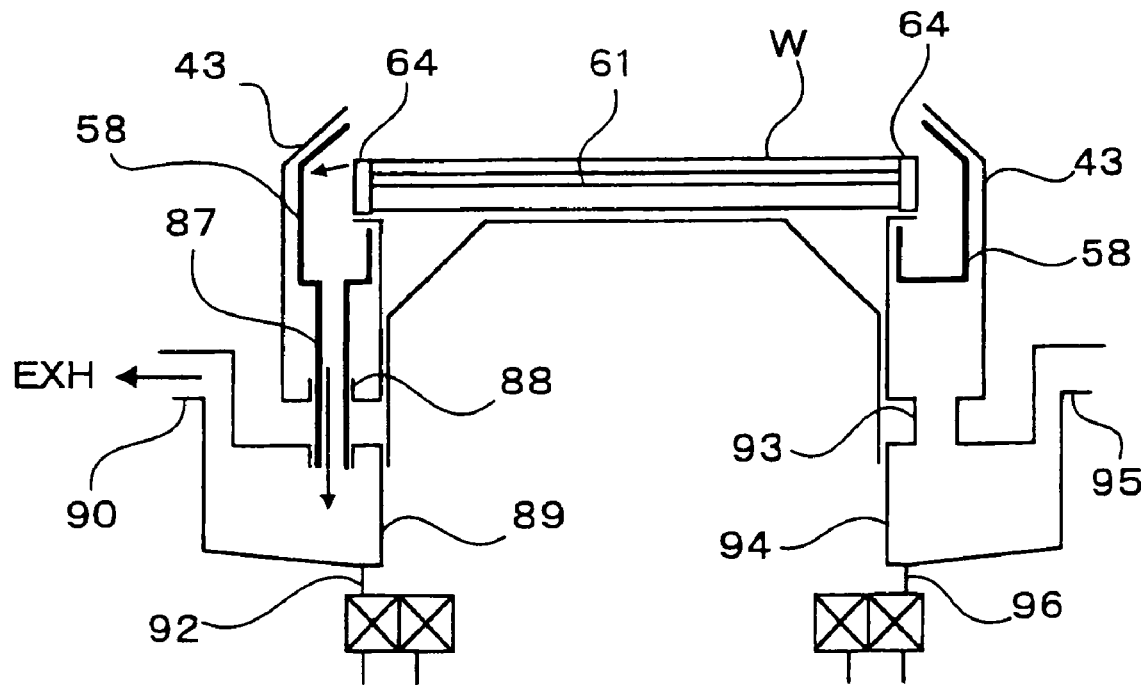
F I G. 9

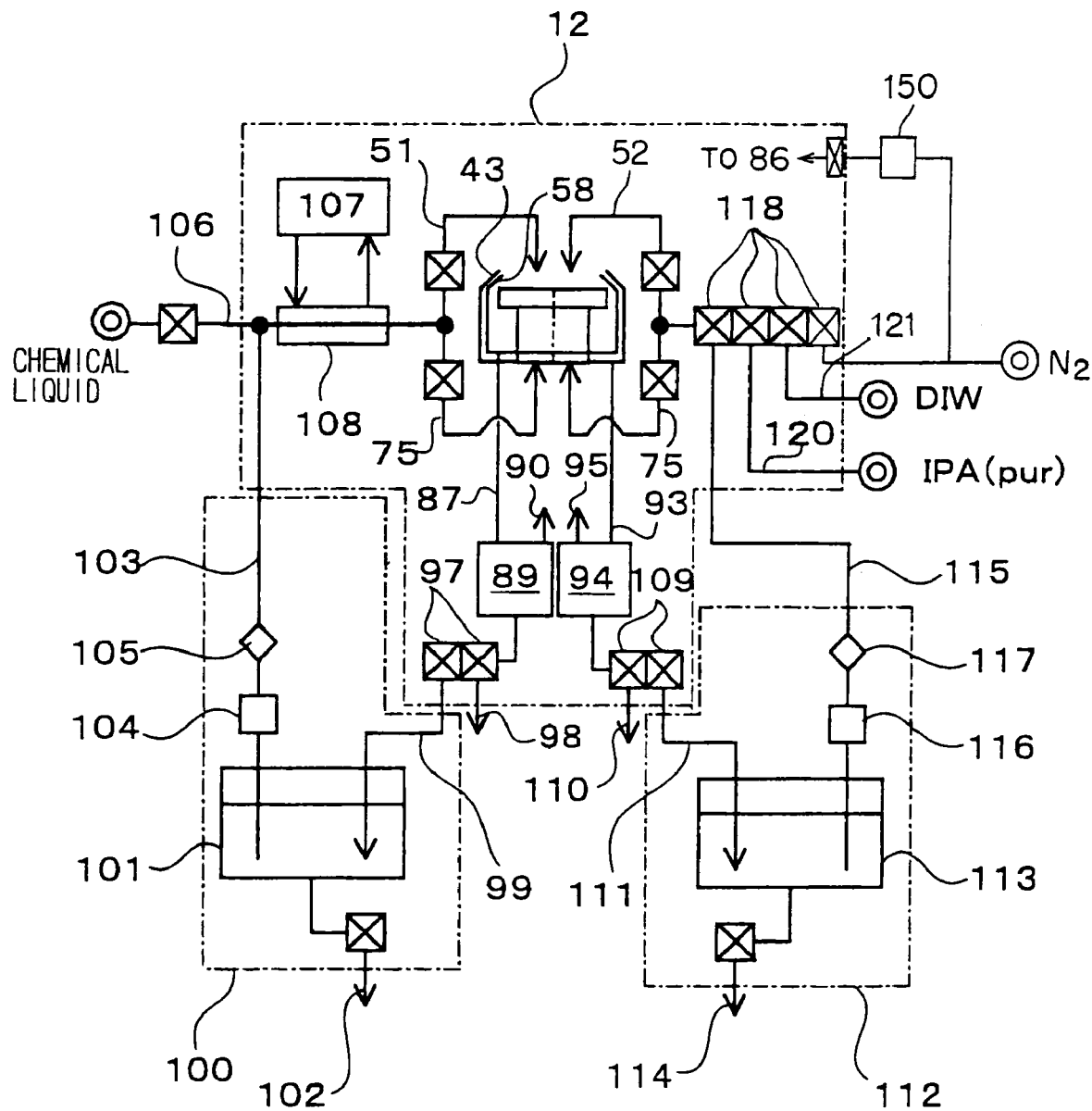
F I G. 11

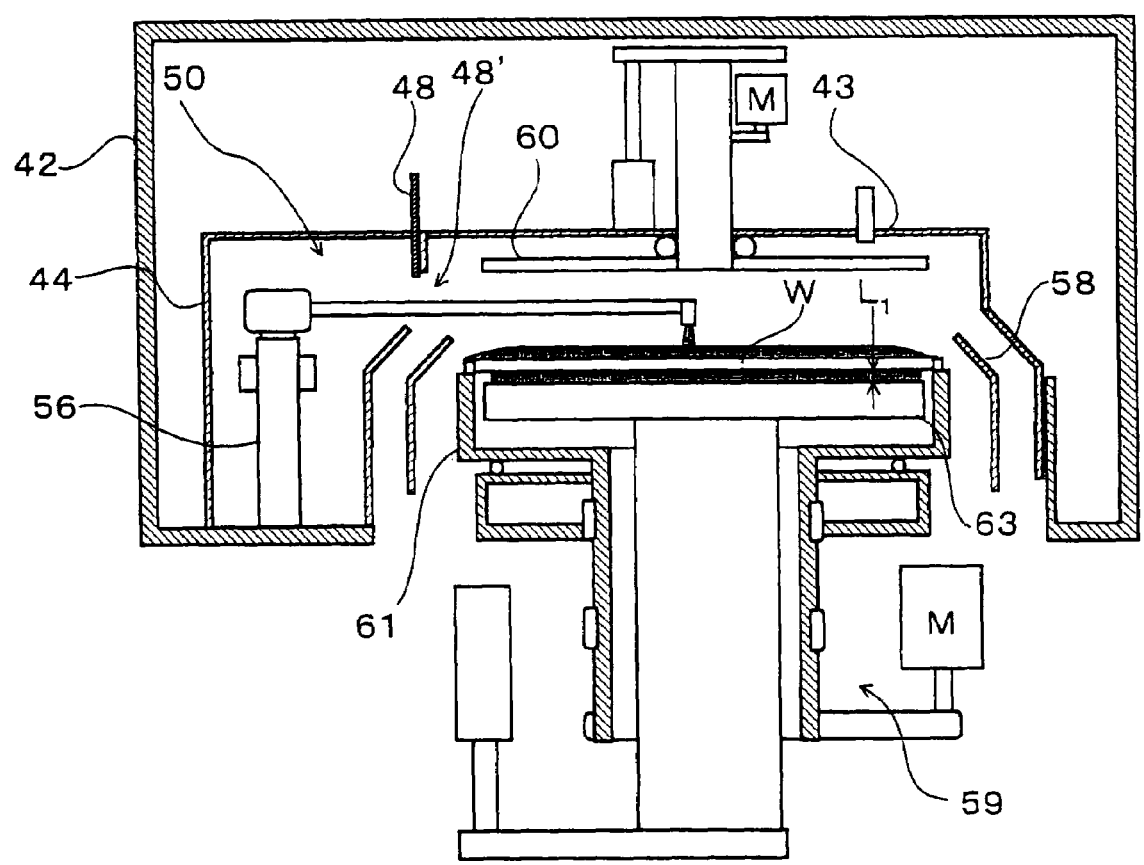
F I G. 12

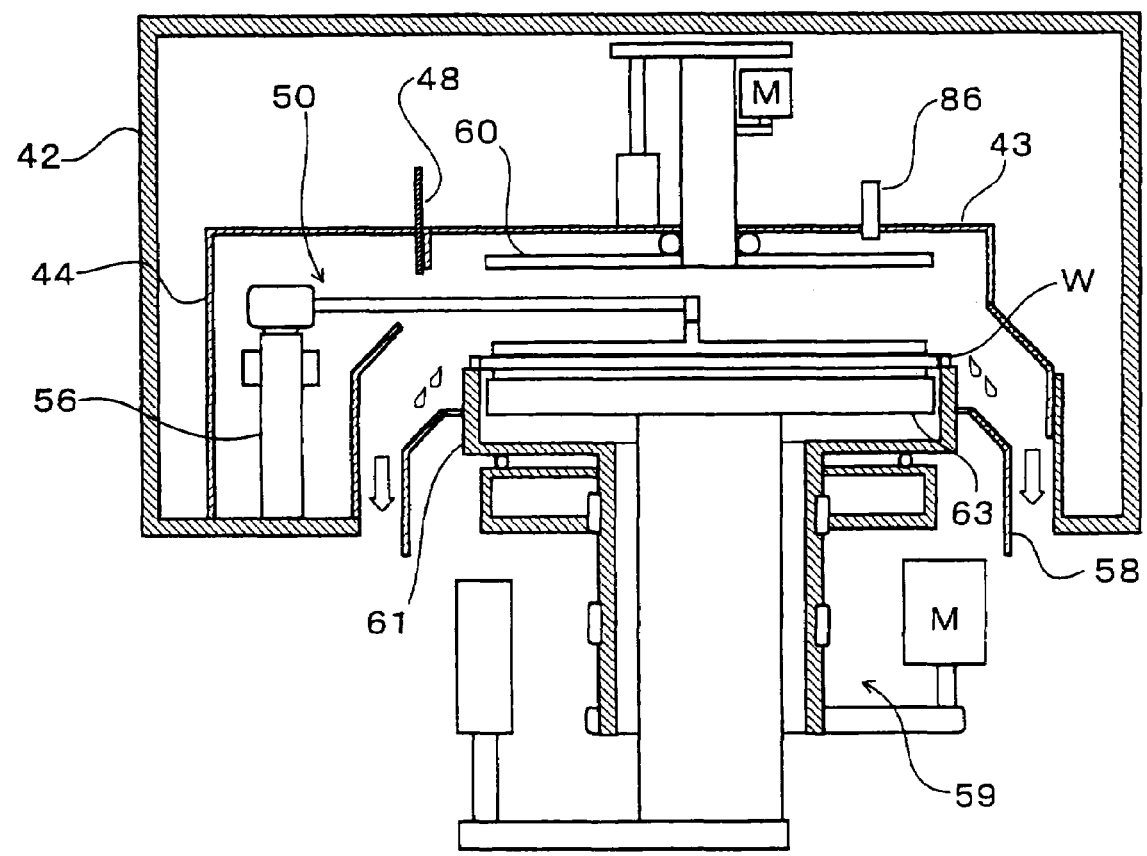
F I G. 14

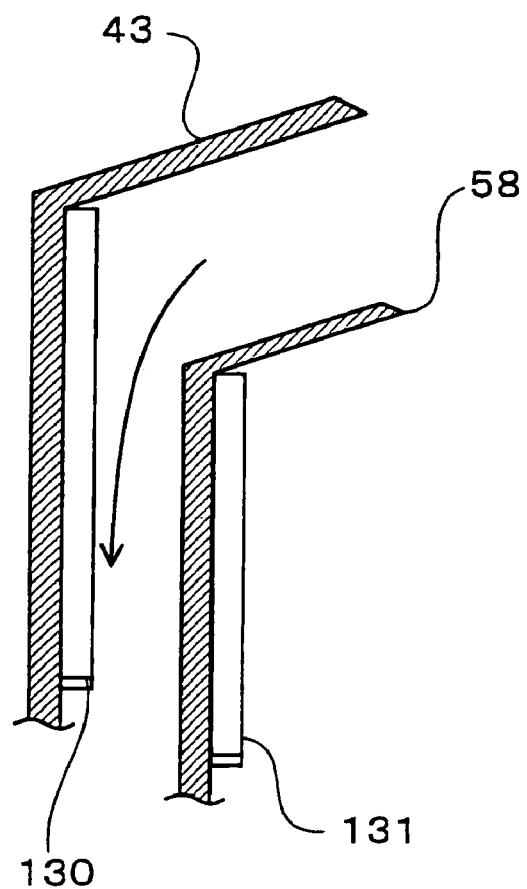
F I G. 16
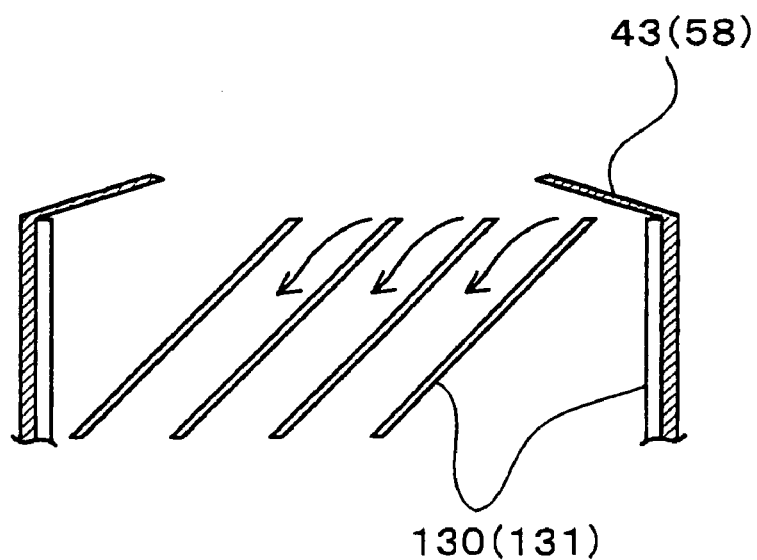
F I G. 17

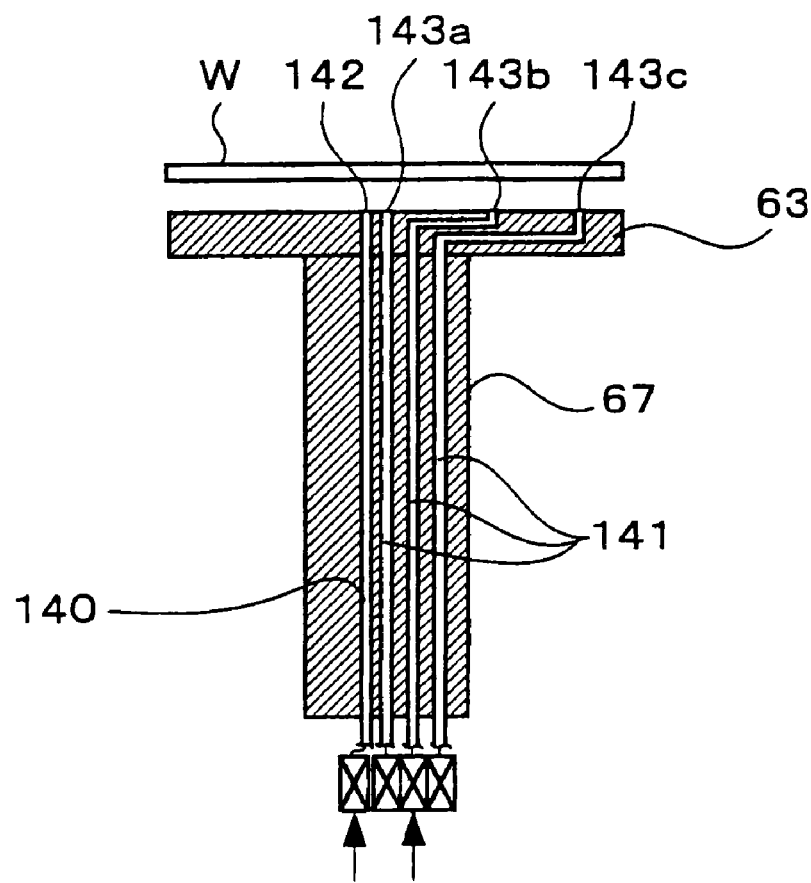
F I G. 18
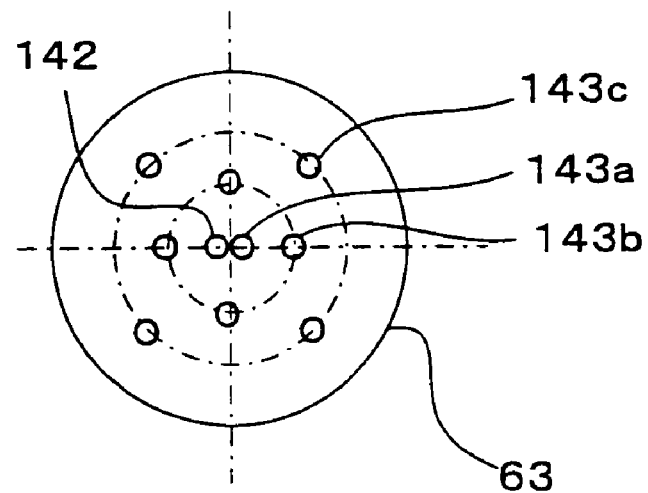
F I G. 19

SUBSTRATE PROCESSING APPARATUS

CROSS REFERENCE TO RELATED APPLICATIONS

This application is a division of Ser. No. 10/195,453, filed Jul. 16, 2002 now U.S. Pat. No. 7,171,973, which is incorporated herein by reference in its entirety.

BACKGROUND OF THE INVENTION

1. Field of the Invention

The present invention relates to a substrate processing apparatus for processing substrates, such as semiconductor wafers or glass substrates for LCDs by a cleaning process or the like.

2. Description of the Related Art

A semiconductor device manufacturing process uses a substrate cleaning system for cleaning semiconductor wafers (hereinafter referred to simply as "wafers") with a cleaning liquid, such as a chemical solution or pure water, to remove contaminants, such as particles, organic contaminants and metallic impurities, from the wafers. There are various known batch substrate cleaning apparatus and known single-wafer substrate cleaning apparatus for such a substrate cleaning system. A prior art substrate-cleaning apparatus disclosed in Japanese patent laid-open publication "JP Hei08-78368 A" has a plate disposed close to the surface of a wafer, and supplies a processing liquid or a processing gas into the gap between the surface of the wafer and the plate for a cleaning process. This prior art substrate-cleaning apparatus has an advantage in that the same is capable of achieving a cleaning process at a low consumption of the processing liquid or the processing gas.

In this prior art substrate cleaning apparatus, however, a processing medium supply means for supplying the processing liquid or the processing gas to the substrate is disposed in a substrate-processing space and is exposed to a substrate-processing atmosphere. Therefore, it is possible that the substrate-processing atmosphere produced by the processing medium supply means for supplying the processing liquid or the processing gas diffuses and exerts bad influence on the processed substrate. It is also possible that the processing medium supply means is contaminated with an atmosphere of the processing liquid or the processing gas diffused during a substrate-processing process, in which the processing medium supply means is held in a waiting state. If the substrate cleaning apparatus is provided with a plurality of processing medium supply means, it is possible that the plurality processing medium supply means exert bad influences on each other.

In addition, it is also possible that the processing atmosphere of the processing liquid remains in a cleaning unit after the completion of the cleaning process, and the processing liquid remaining in the processing unit exerts bad influences on the processed wafer. A high-temperature processing liquid is liable to remain in mist in an upper part of the cleaning unit and hence it is highly possible for the mist of the processing liquid to exert bad influences on the wafer.

A substrate-processing atmosphere of the processing liquid is liable to leak from the conventional substrate processing device when a substrate is loaded into or unloaded from the substrate processing device, and there is the possibility that a carrying device and such included in the cleaning system are corroded by the leaked substrate-processing atmosphere of the processing liquid. Therefore the carrying device and such must be rust-proofed. However, most carrying devices and such are formed from explosion-proof materials. Therefore, materials for forming the components of the carrying devices and the like need to be both rustproof and explosion-proof and it is difficult to select such materials.

SUMMARY OF THE INVENTION

Accordingly, it is an object of the present invention to provide a substrate processing apparatus capable of avoiding the exertion of bad influences of a substrate-processing atmosphere produced by a processing medium supply means on a processed substrate while the processed wafer is in a waiting state, and of preventing the contamination of the processing medium supply means with an atmosphere of the processing liquid or an atmosphere produced by other processing medium supply means.

Another object of the present invention is to provide a substrate processing apparatus capable of effectively controlling a substrate-processing atmosphere of a processing liquid in one unit.

With the foregoing objectives in view, the present invention provides a substrate processing apparatus, which includes: a substrate support member that supports a substrate; an enclosure structure enclosing the substrate support member, defining a processing space, and provided with openings; a shutter adapted to be operated to close and open the openings of the enclosure structure; and a processing fluid supply unit arranged outside the enclosure structure, and provided with a supply port through which a processing fluid for processing a substrate is supplied onto the substrate supported by the substrate support member, wherein at least a part of the processing fluid supply unit including the supply port is advanced through the opening of the enclosure structure into the processing space when the supply unit feeds the processing fluid onto the substrate.

The apparatus may further include a cup disposed in the processing space and surrounding the substrate support member.

The apparatus may further include a top-plate adapted to move, relative to the substrate supported by the substrate support member, between a first position where the top-plate is close to an upper face of the substrate supported by the substrate support member and a second position where the top-plate is remote from the upper face of the substrate supported by the substrate support member.

The apparatus may further include an under-plate adapted to move, relative to the substrate supported by the substrate support member, between a first position where the under-plate is close to a lower face of the substrate supported by the substrate support member and a second position where the under-plate is remote from the lower face of the substrate supported by the substrate support member.

The apparatus may further include a second enclosure structure enclosing the first enclosure structure and defining a space between the first and second enclosure structures.

According to the second aspect of the present invention, there is further provided a substrate processing apparatus, which includes: a substrate support member that supports a substrate arranged in a processing space; a first processing fluid supply unit that supplies a processing fluid onto a substrate supported by the substrate support member; a second processing fluid supply unit that supplies a processing fluid onto a substrate supported by the substrate support member; a first housing defining a first room separated from the processing space in which the substrate support member is arranged, the first room being adapted to accommodate the first processing fluid supply unit; and a second housing defining a second room separated from the first room and from the processing space in which the substrate support member is arranged, the second room being adapted to accommodate the second processing fluid supply unit.

The apparatus may further include an enclosure structure defining the processing space in which the substrate support member is arranged.

The apparatus may further include two cleaning units disposed in the first room and the second room, respectively.

In a specific embodiment, the first processing fluid supply unit supplies a chemical liquid, and the second processing fluid supply unit supplies a rinse liquid.

According to the third aspect of the present invention, there is further provided a substrate processing apparatus, which includes: a substrate support member that supports a substrate; a first enclosure structure enclosing the substrate support member, defining a processing space, and provided with an opening; a first shutter adapted to be operated to open and close the opening of the first enclosure structure; a second enclosure structure enclosing the first enclosure structure, defining a space between the first and second enclosure structures, and provided with an opening; and a second shutter adapted to be operated to open and close the opening of the second enclosure structure.

The apparatus may further include a top-plate adapted to move, relative to the substrate supported by the substrate support member, between a first position where the top-plate is close to an upper face of the substrate supported by the substrate support member and a second position where the top-plate is remote from the upper face of the substrate supported by the substrate support member.

The apparatus may further include an inert gas supplying means that supplies inert gas into an area above the top-plate in the processing space.

In a specific embodiment, the top-plate is rotatable.

According to the fourth aspect of the present invention, there is further provided a substrate processing apparatus, which includes: a substrate support member that supports a substrate; an enclosure structure enclosing the substrate support member, defining a processing space, and provided with an opening; a top-plate adapted to move, relative to the substrate supported by the substrate support member, between a first position where the top-plate is close to an upper face of the substrate supported by the substrate support member and a second position where the top-plate is remote from the upper face of the substrate supported by the substrate support member; and an inert gas supply means that supplies inert gas into an area above the top-plate in the processing space.

In a specific embodiment, the top-plate is rotatable.

The apparatus may further include an exhaust mechanism that discharges an atmosphere of the processing space.

The apparatus may further include a cup arranged in the processing space and surrounding the substrate support member.

In a specific embodiment, the cup and the substrate support member capable of relative movement.

The apparatus may further include an exhaust mechanism that discharges an atmosphere of a space surrounded by the cup.

The apparatus may further include an under-plate adapted to move, relative to the substrate supported by the substrate support member, between a first position where the under-plate is close to a lower face of the substrate supported by the substrate support member and a second position where the under-plate is remote from the lower face of the substrate supported by the substrate support member.

The apparatus may further include a temperature regulator that controls temperature of the inert gas to be supplied by the inert gas supply means.

The apparatus may further include a processing fluid supply unit for supplying a processing fluid onto a substrate supported on the substrate support member. In this case, the temperature regulator controls the temperature of the inert gas so that, when temperature of the processing fluid is higher than a room temperature, the temperature of the inert gas is equal to or higher than the temperature of the processing fluid, and when the temperature of the processing fluid is lower than a room temperature, the temperature of the inert gas is equal to or lower than the temperature the processing fluid.

In the following description of the present invention, a substrate is, for example, a semiconductor wafer or a glass substrate for LCDs. The substrate may be a CD substrate, a printed wiring board or a ceramic substrate. A processing fluid is a processing liquid or a processing gas. Possible processing fluids include cleaning liquids, such as various chemical solutions and pure water, processing liquids for treating wafers by various processes, and processing gases for treating wafers by various processes. The substrate processing apparatus is embodied in a substrate cleaning system that carries out a cleaning process for cleaning, for example, wafers with a cleaning liquid.

BRIEF DESCRIPTION OF THE DRAWINGS

The above and other objectives, features and advantages of the present invention will become more apparent from the following description taken in connection with the accompanying drawings, in which:

FIG. 8 is an enlarged longitudinal sectional view of an upper part of an outer chamber;

FIG. 9 is a schematic sectional view of assistance in explaining a draining process for draining liquid drops from an inner cup into a mist trap;

FIG. 11 is diagrammatic view of an IPA circulation unit and a processing liquid circulation unit;

FIG. 12 is a longitudinal sectional view of assistance in explaining a wetting process for wetting both the surfaces of a wafer with a chemical solution;

FIG. 14 is a longitudinal sectional view of assistance in explaining a gas supply process for supplying $N_2$ gas onto both the surfaces of a wafer;

FIG. 16 is a view of an outer vessel and an inner cup respectively provided with straightening plates on their inner surface;

FIG. 17 is a view of an outer vessel and an inner cup respectively provided with straightening plates on their inner surface;

FIG. 18 is a sectional view of an under-plate and an under-shaft in modifications; and FIG. 19 is a plan view of an under-plate in another modification.

DESCRIPTION OF THE PREFERRED EMBODIMENTS

Figure 1:
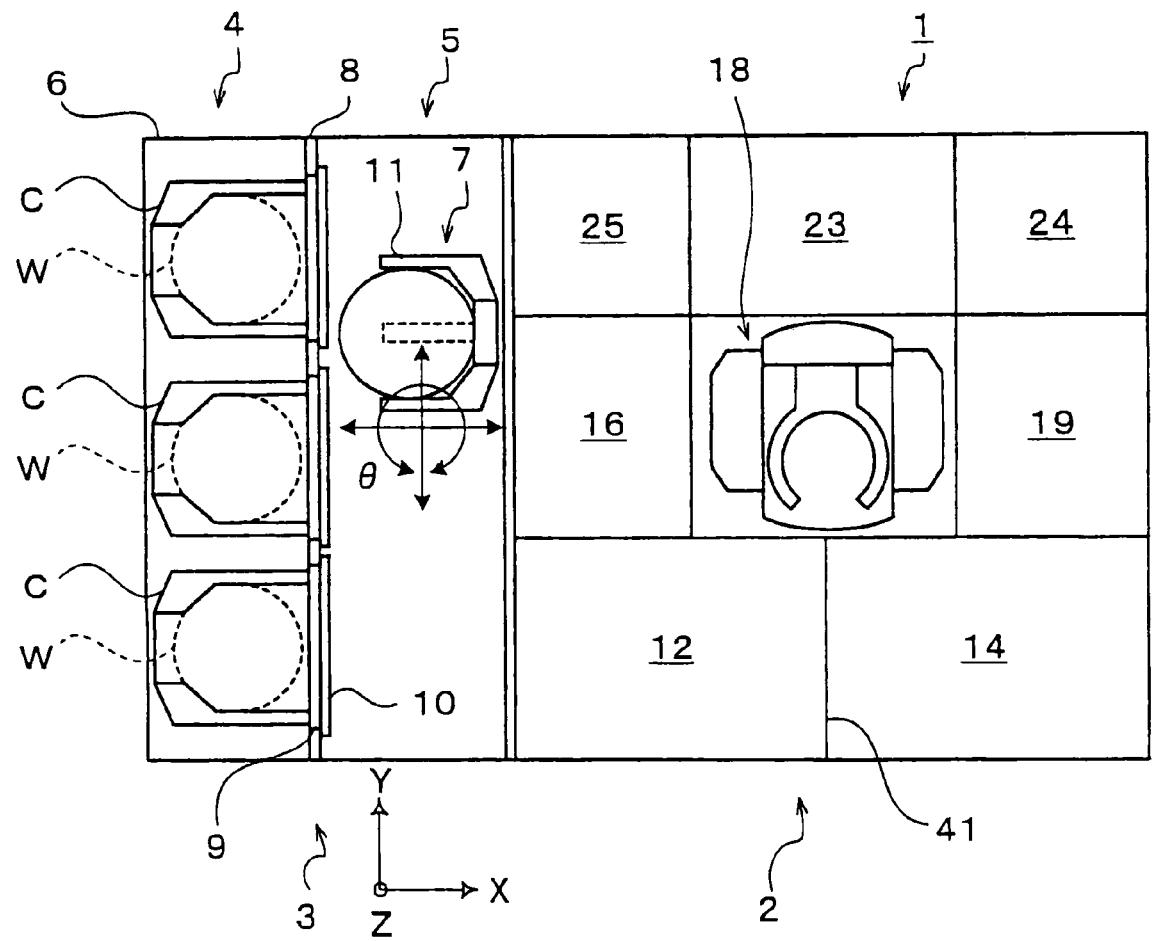
FIG. 1 is a plan view of a cleaning system.
Figure 2:
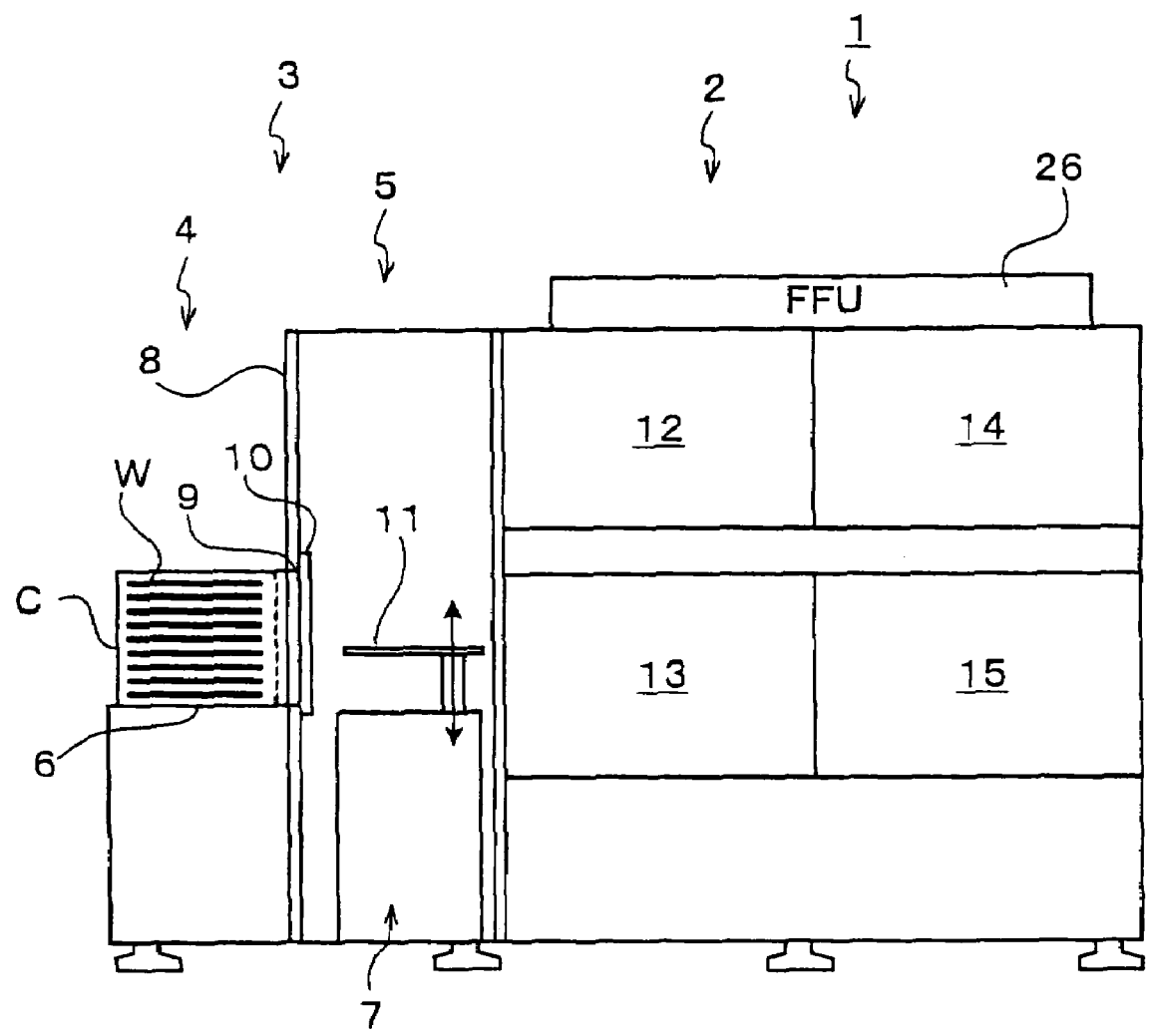
FIG. 2 is a side elevation of the cleaning system shown in FIG. 1.

A substrate cleaning unit for cleaning both the surfaces of a wafer W, i.e., a substrate, will be described as a preferred embodiment of a substrate processing apparatus according to the present invention. FIGS. 1 and 2 are a plan view and a side elevation, respectively, of a cleaning system 1 provided with substrate cleaning units 12, 13, 14 and 15. The cleaning system 1 includes a processing section 2 for cleaning a wafer W by a wafer-cleaning process and heating the wafer W by a thermal process, a delivery section 3 for carrying the wafer W to and carrying the same away from the processing section 2.

The delivery section 3 has a carrier delivery port 4 and a wafer-carrying part 5. The carrier delivery port 4 has a table 6. A carrier C holding, for example, twenty-five wafers W at intervals in a horizontal position is placed on the table 6. The wafer-carrying part 5 is provided with a wafer transfer mechanism 7 for transferring wafers between the carrier C placed on the table 6 and the processing section 2.

The carrier C has an opening formed in one side thereof and closed by a lid. Wafers W are put into and taken out of the carrier C through the opening. Ledges for supporting wafers W thereon are attached to the inner side surfaces of the carrier C so as to form twenty-five slots for accommodating wafers W at predetermined intervals. Each wafer W is inserted in the slot with its surface on which semiconductor devices are to be formed facing up.

Three carriers C, for instance, can be mounted on the surface of the table 6 of the carrier delivery port 4 in a horizontal, linear arrangement in a Y-direction, with their sides provided with the lids facing a partition wall 8 separating the carrier delivery port 4 and the wafer-carrying part 5. The partition wall 8 is provided with windows 9 in parts thereof respectively corresponding to positions where the carriers C are located. A window closing mechanism 10 is disposed on the side of the wafer-carrying part 5 of each window 9.

The window closing mechanism 10 is provided with a shutter or the like for closing the window 9. The window closing mechanism 10 is capable of operating the shutter to open and close the window 9 and of operating the lid to open and close the carrier C. Preferably, the operation of the window closing mechanism 10 is inhibited by an interlocking mechanism while any carrier C is not located at the predetermined position. The window 9 is opened and the lid of the carrier C is removed to open the carrier C into the wafer-carrying device 5. Then the wafer transfer mechanism 7 of the wafer-carrying part 5 is able to access the carrier C and able to carry a wafer W. A wafer detector, not shown, is disposed in an upper part of the window 9 to detect the number of wafers W contained in the carrier C and the state of each wafer W in each slot. The wafer detector may be included in the window closing mechanism 10.

The wafer transfer mechanism 7 of the wafer-carrying part 5 is capable of moving in the Y-direction and a Z-direction and of turning in an X-Y plane (θ-direction). The wafer transfer mechanism 7 has a wafer-handling arm 11 capable of gripping and carrying a wafer W and of moving in an X-direction. The wafer transfer mechanism 7 is capable of accessing the slot at any height of any one of the carriers C located on the table 6 and of accessing either the wafer transfer device 16 or 17 disposed in a vertical arrangement in the processing section 2 to transfer a wafer W from the carrier delivery port 4 to the processing section 2 or from the processing section 2 to the carrier delivery port 4.

The processing section 2 has a main wafer-carrying mechanism 18, the two wafer transfer devices 16 and 17, the four substrate cleaning units 12, 13, 14 and 15, three heating units 19, 20 and 21 for heating and drying wafers W, and a cooling unit 22 for cooling heated wafers W. The main wafer-carrying mechanism 18 is capable of accessing the wafer transfer units 16 and 17, the substrate cleaning units 12, 13, 14 and 15, the heating units 19, 20 and 21 and the cooling unit 22. A wafer W is held temporarily in the wafer transfer unit 16 or 17 before the wafer W is transferred from the wafer-carrying part 5 to the processing section 2 or from the processing section 2 to the wafer-carrying device 5.

The processing section 2 includes a power unit 23 for supplying power to the cleaning system 1, a machine control unit 24 for controlling the operations of the component devices of the cleaning system 1 and the general operations of the cleaning system 1, and a processing liquid storage unit 25 for storing a predetermined cleaning liquid to the substrate cleaning units 12, 13, 14 and 15. The power unit 23 is connected to a main power source, not shown. A fan-and-filter unit (FFU) 26 for supplying clean air to the foregoing units and the main wafer-carrying mechanism 18 is installed on the ceiling of the processing section 2.

The power unit 23, the processing liquid storage unit 25 and the machine control unit 24 may be disposed outside the processing section 2, or the units 23, 24 and 25 may be installed in the processing section 2 so that the same can be pulled out of the processing section 2. This facilitates the maintenance of the wafer transfer units 16 and 17, the main waver-carrying mechanism 18, the heating units 19, 20 and 21, and the cooling unit 22.

Figure 3:
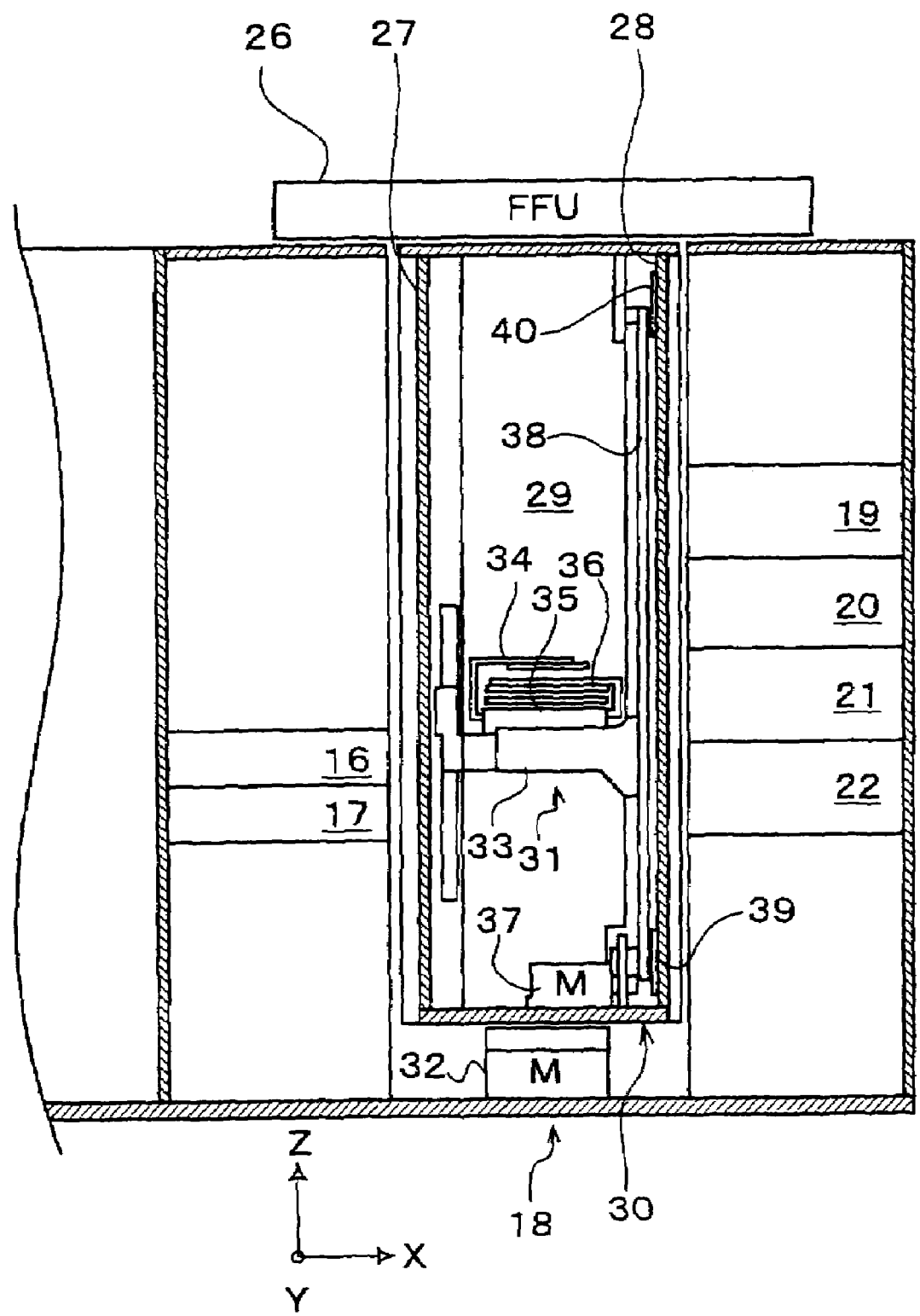
FIG. 3 is a sectional view of the cleaning system shown in FIG. 1, schematically showing the arrangement of a wafer transfer unit, a main wafer-carrying unit, a heating unit and a cooling unit.

FIG. 3 is a schematic sectional view of assistance in explaining the arrangement of the wafer transfer units 16 and 17, the main wafer carrying mechanism 18 adjacent to the wafer transfer units 16 and 17 with respect to the X-direction, the heating units 19, 20 and 21, and the cooling unit 22. The wafer transfer units 16 and 17 are disposed in a vertical arrangement. The lower wafer transfer unit 17 is used to transfer a wafer W from the carrier delivery port 4 to the processing section 2. The upper wafer transfer unit 16 is used for transferring a wafer W from the processing section 2 to the carrier delivery port 4.

Part of air supplied by the FFU 26 flows through the wafer transfer units 16 and 17 and a space over the wafer transfer units 16 and 17 into the waver-carrying device 5. Thereby, the flow of particles from the wafer-carrying part 5 into the processing section 2 can be prevented to maintain the processing section 2 in a satisfactory cleanliness.

The main wafer-carrying mechanism 18 has a cylindrical support member 30 having vertical walls 27 and 28 and a side opening 29 formed between the vertical walls 27 and 28, and a wafer carrier 31 placed in the cylindrical support member 30 for vertical movement. The cylindrical support member 30 can be driven for turning by a motor 32 together with the wafer carrier 31. The wafer carrier 31 has a carrying base 33, and three carrying arms 34, 35 and 36 capable of moving along the base 33. The carrying arms 34, 35 and 36 are formed in sizes such that the carrying arms 34, 35 and 36 are able to move through the side opening 29. The carrying arms 34, 35 and 36 are moved individually for forward and backward movement by a driving mechanism including a motor built in the carrying base 33, and a belt mechanism. The wafer carrier 31 is driven by a motor 37 through a belt 38 extended between a drive pulley 39 and a driven pulley 40 for vertical movement.

The three heating units 19, 20 and 21 are stacked on the cooling unit 22 for the forced cooling of a wafer W. The heating units 19, 20 and 21 and the cooling unit 22 may be installed in the space over the wafer transfer units 16 and 17. When the heating units 19, 20 and 21 and the cooling unit 22 are installed in the space over the wafer transfer units 16 and 17, a space occupied by the heating units 19, 20 and 21 and the cooling unit 22 shown in FIG. 1 can be used as a utility space.

The substrate cleaning units 12, 13, 14 and 15 are stacked in two layers each for two of them. As shown in FIG. 1, the substrate cleaning units 12 and 14 have symmetrical structure with respect to a wall 41 separating the units 12 and 14 from each other. The substrate cleaning units 13 and 15 have symmetrical structure with respect to a wall 41 separating the units 13 and 15 from each other. The substrate cleaning units 12, 13, 14 and 15 are substantially the same in construction, except that the substrate cleaning units 12 and 14 are symmetrical and the substrate cleaning units 13 and 15 are symmetrical. Therefore, the construction of only the substrate cleaning unit 12 will be described by way of example.

Figure 4:
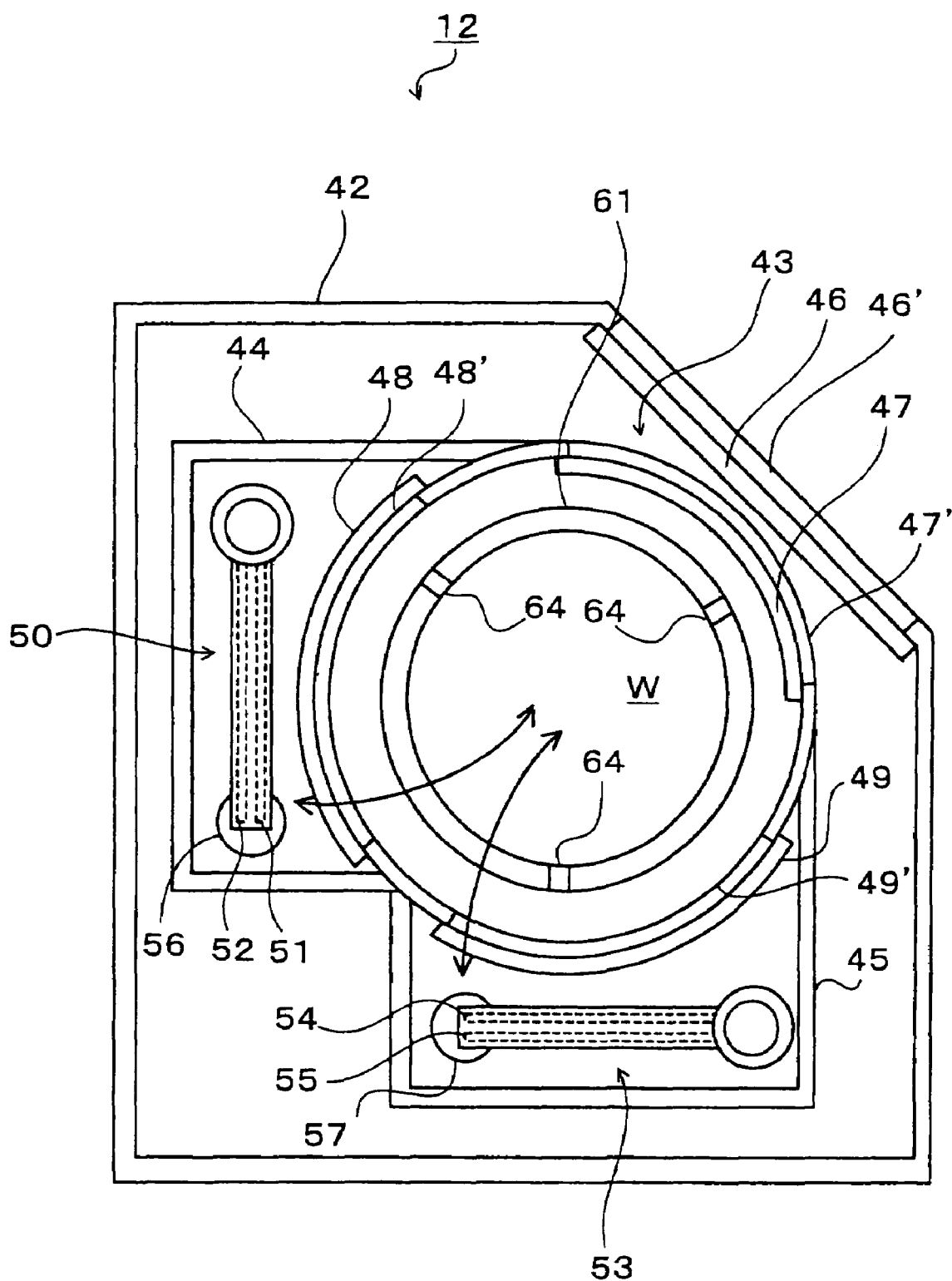
FIG. 4 is a plan view of a substrate-cleaning unit in a preferred embodiment according to the present invention.

Referring to FIG. 4 showing the substrate-cleaning unit 12 in a plan view, installed in a space defined by a unit casing 42 is a chamber casing 43 defining a processing chamber 43A, a chemical liquid supply arm housing 44 defining a storage chamber for chemical liquid supply arm 50, and a rinsing-and-drying arm housing 45 defining a storage chamber for rinsing-and-drying arm 55. The unit casing 42 is provided with an opening 46' covered with a mechanical shutter 46 operated by a shutter operating mechanism, not shown. When carrying a wafer W by the carrying arm through the opening 46' into the substrate-cleaning unit 12, the mechanical shutter 46 is opened. The mechanical shutter 46 is on the inner side of the opening 46' so that an atmosphere in the unit casing 42 may not leak outside even if the interior space of the unit casing 42 is at a positive pressure.

The chamber casing 43 is provided with an opening 47'. The opening 47' is covered with a shutter 47 for the chamber casing 43 operated by a cylinder actuator, not shown. When carrying a wafer W by the carrying arm 34 through the opening 47' into the processing chamber 43A, the shutter 47 is opened. Both the mechanical shutter 46 for the unit casing 42 and the shutter 47 for the chamber casing 43 may be operated by one and the same shutter operating mechanism. The shutter 47 is on the inner side of the opening 47, so that an atmosphere in the chamber casing 43 may not leak outside even if the interior space of the chamber casing 43 is at a positive pressure. The chamber casing 43 is provided with an opening 48'. The opening 48' is covered with a shutter 48 for closing the processing liquid supply arm storage chamber defined by the chemical liquid supply arm housing 44. The shutter 48 is operated by a shutter operating mechanism, not shown. When isolating the chemical liquid supply arm housing 44 from the processing chamber 43A, the shutter 48 is closed. The chamber casing 43 is provided with an opening 49'. The opening 49' is covered with a shutter 49 for closing the rinsing-and-drying arm storage chamber defined by the rinsing-and-drying arm housing 45. The shutter 49 is operated by a shutter operating mechanism, not shown. When isolating the interior of the rinsing-and-drying arm housing 45 from the processing chamber 43A, the shutter 49 is closed.

A chemical liquid supply arm 50 is housed in the chemical liquid supply arm housing 44. The arm 50 has two spouting systems, one for spouting a chemical liquid and $N_2$ gas, the other for spouting IPA and pure water. The arm 50 can be moved into the processing chamber 43A and can be moved so as to sweep the surface of a wafer W supported on a spin chuck 59 from the center to the periphery of the wafer W. The chemical liquid supply arm 50 is retracted into the chemical liquid supply arm housing 44 when the same is not in use for processing. Since an atmosphere of the processing liquid prevails always in the chemical liquid supply arm housing 44, the component parts of the chemical liquid supply arm 50 and the chemical liquid supply arm housing 44 are formed of corrosion-resistant materials. The arm 50 is provided with a chemical liquid pouring nozzle 51 and a rinsing liquid pouring nozzle 52. The chemical liquid and $N_2$ gas is poured through the chemical liquid pouring nozzle 51, and IPA and pure water is poured through the rinsing liquid pouring nozzle 52. The chemical liquid supply arm 50 may be further provided with a chemical liquid supply nozzle for pouring a second chemical liquid. The shutter 48 is opened to admit the arm 50 into the processing chamber 43A.

A rinsing-and-drying arm 53 housed in the rinsing-and-drying arm housing 45. The arm 53 has two spouting systems, one for spouting $N_2$ gas, the other for spouting IPA and pure water. The arm 53 turns to be moved into the processing chamber 43A and turns to be moved so as to sweep the surface of a wafer W supported on the spin chuck 59 from the center to the periphery of the wafer W. The arm 53 is retracted into the housing 45 when the same is not in use for processing. Although any atmosphere of a processing liquid does not prevail in the housing 45, the component parts of the arm 53 and the housing 45 may be formed of corrosion-resistant materials. The arm 53 is provided with a $N_2$ gas spouting nozzle 54 and a rinsing liquid pouring nozzle 55. $N_2$ gas is spouted through the $N_2$ gas spouting nozzle 54, and IPA and pure water is poured through the rinsing nozzle 55. The shutter 49 for rinsing-and-drying arm housing 45 is opened to admit the rinsing-and-drying arm 53 into the processing chamber 43A through the opening 49'.

A cleaning device 56 for cleaning the chemical liquid supply arm 50 is disposed in the chemical liquid supply arm housing 44 to clean the arm 50 when necessary. When cleaning the arm 50, the shutter 48 is closed to prevent the leakage of a cleaning atmosphere from the interior of the housing 44 into interior of the unit casing 42 and into the processing chamber 43A. A cleaning device 57 for cleaning the rinsing-and-drying arm 53 is disposed in the rinsing-and-drying arm housing 45 to clean the arm 53 when necessary. When cleaning the rinsing-and-drying arm 53, the shutter 49 is closed to prevent the leakage of a cleaning liquid atmosphere from the interior of the housing 45 into interior of the unit casing 42 and into the processing chamber 43A.

Figure 5:
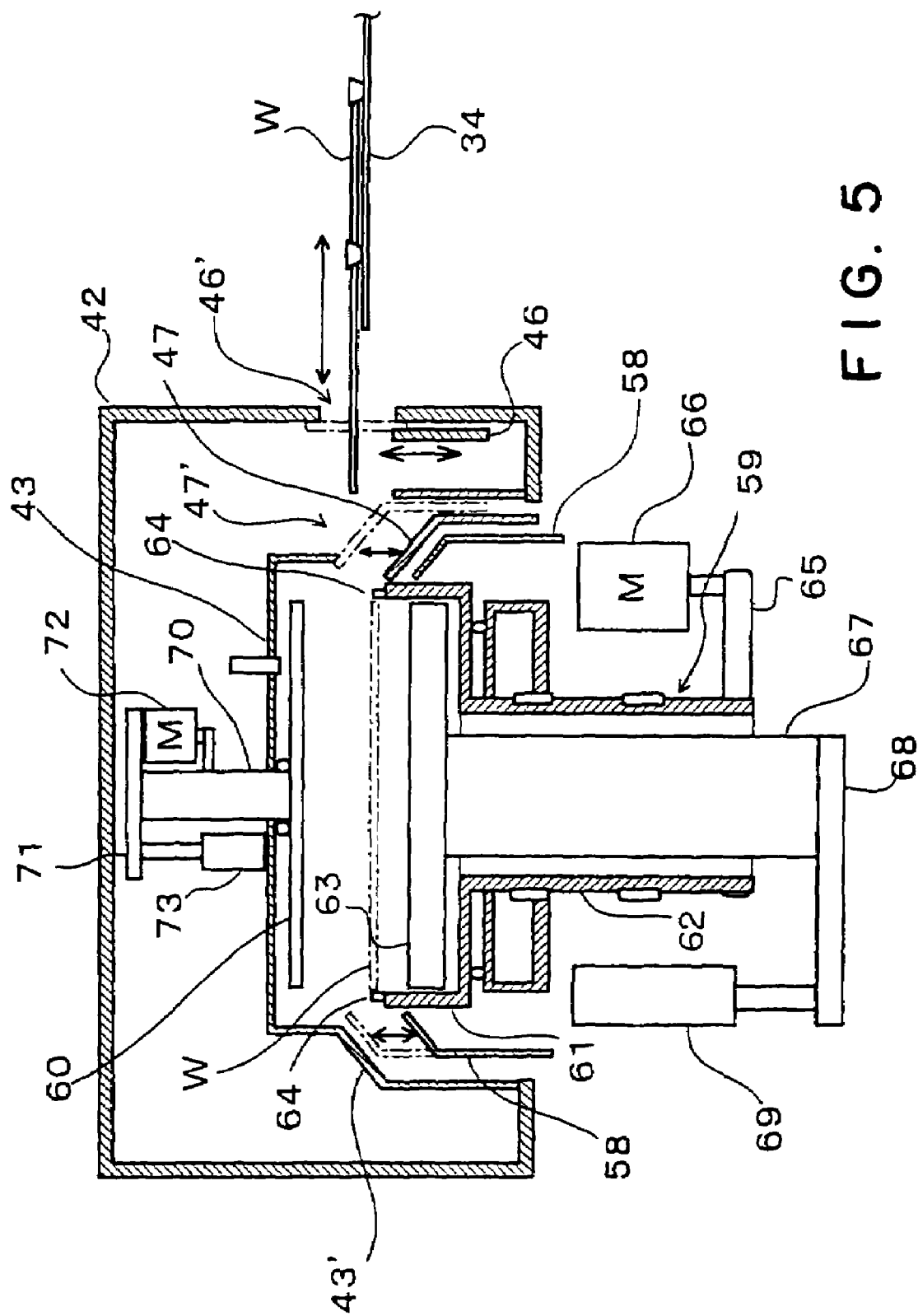
FIG. 5 is a sectional view of the substrate-cleaning unit shown in FIG. 4.

Referring to FIG. 5, arranged in the chamber casing 43 are a cup 58 for surrounding a wafer W, a spin chuck 59 (i.e., a wafer support means) for supporting a wafer W with a surface thereof to be processed faced up, and a top-plate 60 capable of vertically moving relative to the upper surface of a wafer W supported by the spin chuck 59. The chamber casing 43 has a taper wall 43, at a level corresponding to a wafer W supported on the spin chuck 59. The taper wall 43' surrounds a wafer W supported on the spin chuck 59. The shutter 47 of the chamber casing 43 serves as a part of the taper wall 43'. When mounting a wafer W on the spin chuck 59 and removing the same from the spin chuck 59, the wafer W needs only to be moved horizontally after opening the shutter 47.

The spin chuck 59 has a chuck body 61 for supporting a wafer W thereon, and a rotating tubular shaft 62 connected to the bottom of the chuck body 61. An under-plate 63 is disposed inside the chuck body 61. The under-plate 63 is movable relative to the bottom of a wafer W supported on the spin chuck 59.

A plurality of support pins, not shown and a plurality of holding members 64 are connected to an upper part of the chuck body 61 to support and hold a wafer W at a plurality of parts thereof. A belt 65 is extended between the rotating tubular shaft 62 and a drive pulley mounted on the output shaft of a motor 66 to drive the spin chuck 59 for rotation by the motor 66. Each holding member 64 is provided with a weight that is moved by a centrifugal force when the spin chuck 59 is rotated to causes an upper part of the holding member 64 to move radially inward and to engage a peripheral part of the wafer W. The wafer W is supported on the support pins while the spin chuck 59 is at a standstill, and is held by the holding members 64 while the spin chuck 59 is rotating.

Figure 13:
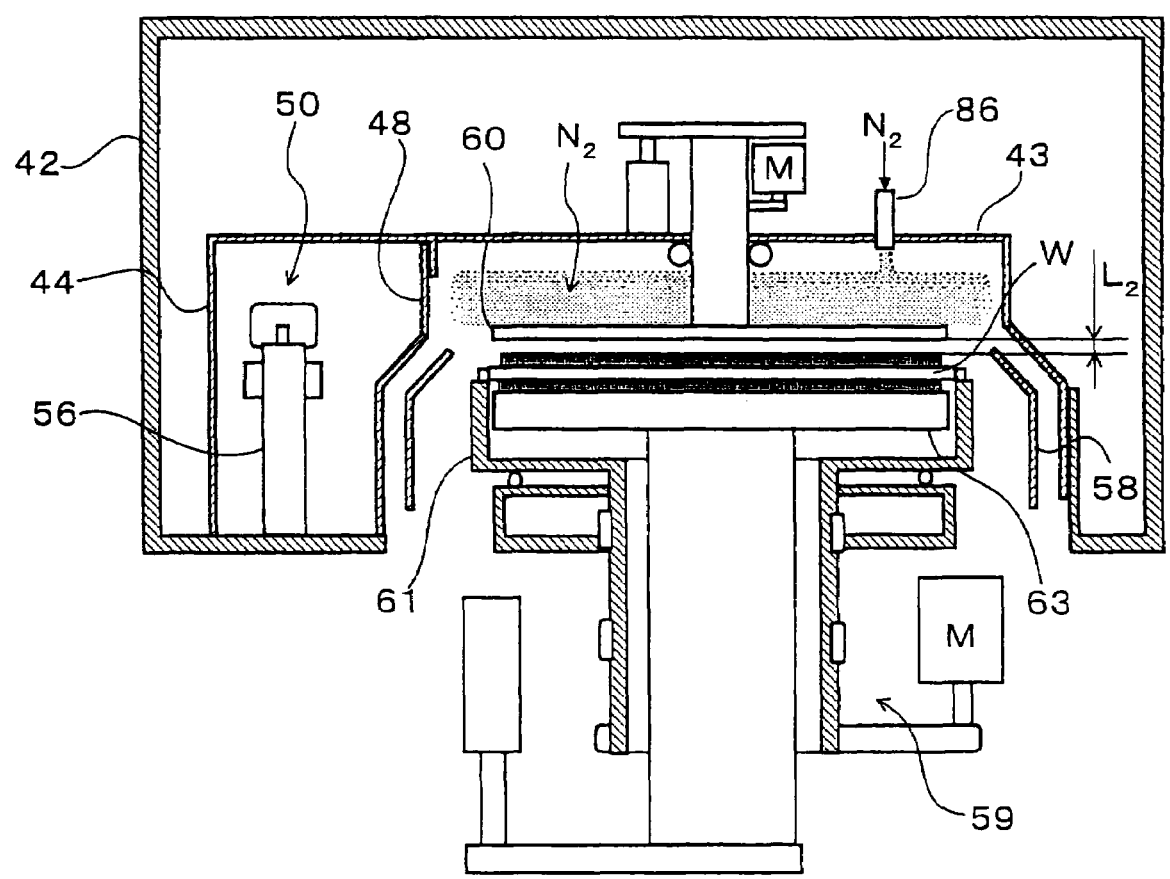
FIG. 13 is a longitudinal sectional view of assistance in explaining a cleaning process for cleaning both the surfaces of a wafer with a chemical solution.

The under-plate 63 is connected to the upper end of an under-plate shaft 67 extending through the rotating tubular shaft 62, and the lower end of the under-plate shaft 67 is connected to the upper surface of a horizontal plate 68. The horizontal plate 68 thus supporting the under-plate shaft 67 is moved vertically by a lifting mechanism 69, such as a pneumatic cylinder actuator. Thus, the under-plate 63 can be vertically moved between a lower waiting position in a lower part of the chuck body 61 as shown in FIG. 5, and a working position in an upper part of the chuck body 61 as shown in FIG. 13. The under-plate 63 is held at the working position while the lower surface of a wafer W supported on the spin chuck 59 is subjected to a cleaning process as shown in FIG. 13. The under-plate 63 may be fixedly held at a predetermined level, and the spin chuck 59 may be moved vertically by a lifting mechanism, not shown, connected to the rotating tubular shaft 62 to move the under-plate 63 between a waiting position and a working position relative to the spin chuck 59.

The top-plate 60 is connected to the lower end of a top-plate shaft 70, and is rotated by a motor 72 mounted on a horizontal plate 71. The top-plate shaft 70 is supported for rotation by the horizontal plate 71 so as to extend vertically downward. A lifting mechanism 73, such as a pneumatic cylinder actuator, fixedly mounted on the upper wall of the chamber casing 43 moves the horizontal plate 71 vertically to move the top-plate 60 vertically between a waiting position and a working position. When the top-plate 60 is in the waiting position, the top-plate 60 is apart from the upper surface of a wafer W supported on the spin chuck 59 as shown in FIG. 5. When the top-plate 60 is in the working position, the top-plate 60 is close to the upper surface of the wafer W as shown in FIG. 13. The top-plate 60 is held at the working position while the upper surface of the wafer W is subjected to a cleaning process.

The cup 58 is vertically movable between a retracted position shown in FIG. 5 (i.e., a lower position) and a working position (i.e., an upper position) shown in FIG. 13. When the cup 58 is in the retracted position, an upper part of the spin chuck 59 protrudes upward beyond the upper end of the cup 58 so that a wafer can be transferred to or removed from the spin chuck 59. When the cup 58 is in the working position, the cup 58 surrounds the spin chuck 59 and a wafer W supported on the spin chuck 59 to prevent the processing liquid supplied onto the wafer from scattering.

When the cup 58 is lowered to the retracted position shown in FIG. 5 and a wafer W is transferred to or removed from the spin chuck 59, the top-plate 60 and the under-plate 63 are held at their waiting positions, respectively, to form a sufficiently wide gap between the under-plate 63 and the wafer W supported on the spin chuck 59, and to form a sufficiently wide gap between the top-plate 60 and the wafer W supported on the spin chuck 59. Thus, the wafer W can be smoothly transferred to or removed from the spin chuck 59.

Figure 6:
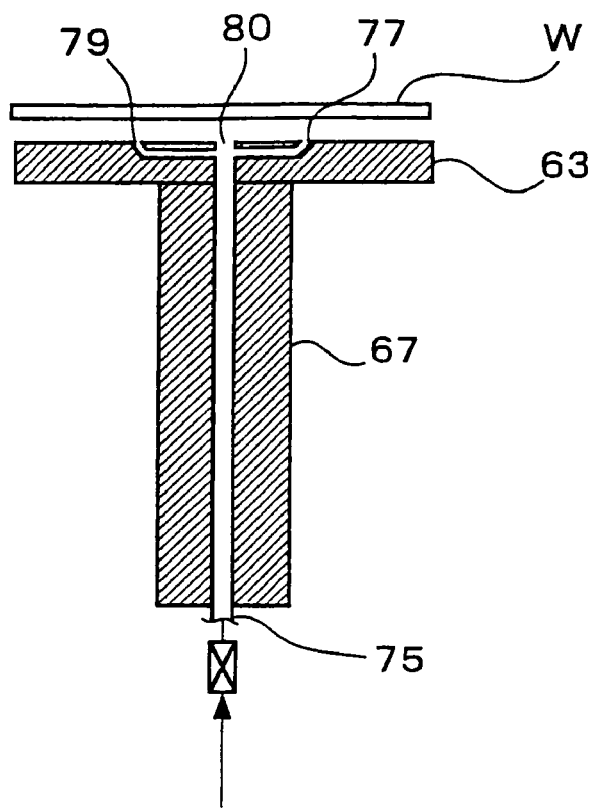
FIG. 6 is a sectional view of an under-plate and an under-shaft.
Figure 7:
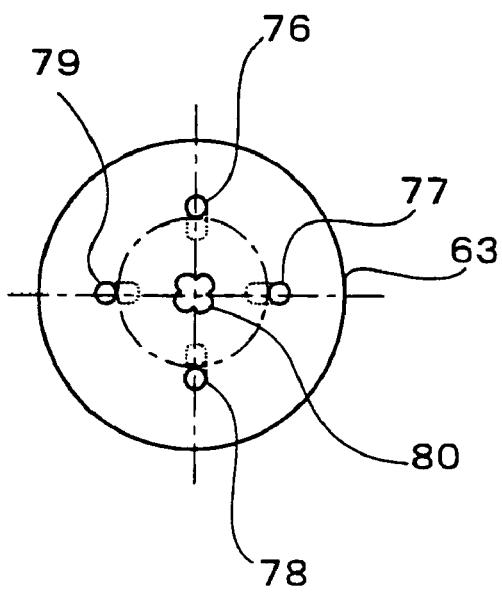
FIG. 7 is a plan view of the under-plate shown in FIG. 6.

Referring to FIG. 6, a fluid passage 75 is extended through the under-plate 63 and the under-plate shaft 67. A cleaning liquid, such as a chemical liquid or pure water, or a drying gas is supplied through the fluid passage 75. As shown in FIG. 7, peripheral nozzle holes 76 to 79 are formed in four peripheral parts of the under-plate 63, and a central nozzle hole 80 is formed in a central part of the under-plate 63. A chemical liquid, IPA, pure water and $N_2$ can be spouted through the nozzle holes 76 to 80. The peripheral nozzle holes 76 to 79 are inclined radially outward.

As shown in FIG. 8, a fluid passage 85 is extended through the top-plate 60 and the top-plate shaft 70. Pure water or a drying gas is supplied through the fluid passage 85. A $N_2$ gas supply port 86 is formed in the top wall of the chamber casing 43. $N_2$ gas is supplied through the $N_2$ gas supply port 86 into a space between the top wall of the chamber casing 43 and the top-plate 60.

Referring to FIG. 9, a cup drain pipe 87 is connected to the bottom wall of the cup 58 to drain a liquid collected in the cup 58. The cup drain pipe 87 is vertically movable through an opening 88 formed in the bottom wall of the chamber casing 43. A lower end part of the cup drain pipe 87 is inserted in a cup mist trap 89. The cup mist trap 89 removes gases, which are typically in the form of gas babbles existing in a liquid, from the liquid drained from the cup 58. The gases removed from the liquid are discharged outside through an exhaust pipe 90 connected to the cup mist trap 89. The liquid eliminated of the gases is recovered through a cup drain line 92 connected to the cup mist trap 89.

A casing drain pipe 93 is connected to the bottom wall of the chamber casing 43 to drain a liquid collected in the processing chamber 43A. The casing drain pipe 93 is connected to a casing mist trap 94. The mist trap removes gases, which are typically in the form of gas babbles existing in a liquid, from the liquid drained from the processing chamber 43A. The gases removed from the liquid are discharged outside through an exhaust pipe 95 connected to the casing mist trap 94. The liquid eliminated of the gases is recovered through a casing drain line 96 connected to the casing mist trap 94.

Figure 10:
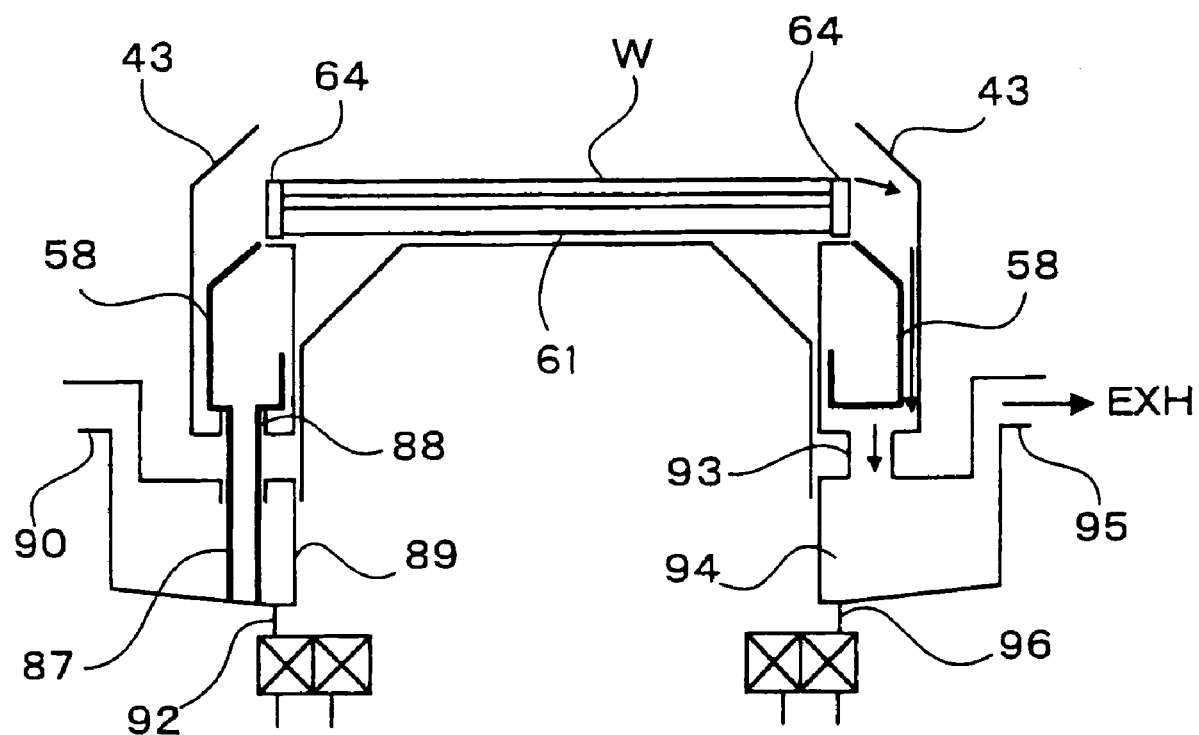
FIG. 10 is a schematic sectional view of assistance in explaining a draining process for draining liquid drops from the outer chamber into a mist trap.

When the cup 58 is lowered to its lower position as shown in FIG. 10, the spin chuck 59 and a wafer W supported on the spin chuck 59 are positioned above the upper end of the cup 58. When the cup 58 is set at the lower position, liquid drops contained in the processing chamber 43A flow down in a space surrounding the cup 58 and are drained through the casing drain pipe 93. The cup 58 surrounds the spin chuck 59 and the wafer supported on the spin chuck 59 to prevent the cleaning liquid or the like supplied onto both the surfaces of the wafer W and splashed by the wafer w from spreading in the casing 43 when the cup 58 is raised to its upper position as shown in FIG. 12. When the cup 58 is set at the upper position, liquid drops scattered in the space surrounded by the cup 58 are drained through the cup drain pipe 87.

FIG. 11 is diagrammatic view of an IPA circulation unit 112 and a processing liquid circulation unit 100. The cup drain line 92 connected to the cup mist trap 89 can be connected to either a drain pipe 98 or a chemical liquid recovery line 99 by a selector valve 97. The chemical liquid recovery line 99 is connected to a tank 101 included in the chemical liquid circulation unit 100. A drain pipe 102 and a chemical liquid circulation line 103 are connected to the tank 101. The chemical liquid circulation line 103 is provided with a pump 104 and a filter 105. The chemical liquid circulation line 103 is connected to a chemical liquid supply line 106. The chemical liquid supply line 106 is connected to the chemical liquid supply nozzle 51 and the fluid passage 75. The chemical liquid supply line 106 is provided with a temperature regulator 108 that regulates the temperature of the chemical liquid with, for example, a heater 107. The temperature of the chemical liquid to be supplied onto the wafer W is regulated. The chemical liquid recovered by the chemical liquid circulation unit 100 is reused.

The casing drain line 96 connected to the casing mist trap 94 can be connected to either a drain pipe 110 or an IPA recovery line 111 by a selector valve 109. The IPA recovery line 111 is connected to a tank 113 included in the IPA circulation unit 112. A drain pipe 114 and an IPA circulation line 115 are connected to the tank 113. The IPA circulation line 115 is provided with a pump 116 and a filter 117. The IPA circulation line 115 can be selectively connected to the rinsing liquid pouring nozzle 52, the rinsing liquid pouring nozzle 55 or the fluid passage 75 by a selector valve 118. IPA recovered by the IPA circulation unit 112 is reused. The selector valve 118 selects either unused IPA (pur) supplied through an IPA supply line 120 or recovered IPA (rec) recovered by the IPA circulation unit 112. The unused IPA (pur) supplied through the IPA supply line 120 is delivered to the rinsing liquid pouring nozzle 55, and the recovered IPA (rec) recovered by the IPA circulation unit 112 is supplied to the rinsing liquid pouring nozzle 52. Either the unused IPA (pur) supplied through the IPA supply line 120 or the recovered IPA (rec) recovered by the IPA circulation unit 112 can be supplied to the fluid passage 75.

The other substrate cleaning units 13, 14 and 15 of the cleaning system 1 are similar in construction to the substrate cleaning unit 12, and are capable of simultaneously cleaning both the surfaces of a wafer W with a cleaning liquid.

In the cleaning system 1, a carrier C holding twenty-five untreated wafers W is carried onto the table 6 of the carrier delivery port 4 by a carrying robot, not shown. The wafer-handling arm 11 takes the wafers W one at a time from the carrier C and transfers the wafer W to the wafer transfer units 16 and 17. The carrying arm 34 carries the wafer W to the substrate cleaning unit 12, 13, 14 or 15. Then, the wafer W is cleaned by a predetermined cleaning process to remove contaminants including particles. After the wafer W has been cleaned by the cleaning process, the wafer transfer mechanism takes out the cleaned wafer W from the substrate-cleaning unit 12, 13, 14 or 15 and transfers the same to the wafer-handling arm 11. Then, the wafer-handling arm 11 put the cleaned wafer W in a carrier C.

The operation of the substrate-cleaning unit 12 for carrying out the cleaning process will be described by way of example. Referring to FIG. 5, the mechanical shutter 46 of the unit casing 42 of the substrate cleaning unit 12 and the shutter 47 of the chamber casing 43 are opened, and then the carrying arm 34 holding a wafer W is advanced into the chamber 43A of the substrate cleaning unit 12 through the openings 46' and 47'. The cup 58 is held at the lower position to expose an upper part of the chuck body 61. As shown in FIG. 5, the under-plate 63 is lowered to the waiting position in side the chuck body 61. The top-plate 60 is raised to the waiting position beforehand. The second shutter 48 for covering the opening 48' and the third shutter 49 for covering the opening 49' are closed.

The main wafer-carrying mechanism 18 moves the carrying arm 34 down, and transfers the wafer W to the holding members 64. The spin chuck 59 supports the wafer W on the support pins, not shown, with a surface of the wafer W provided with semiconductor devices faced up. Since the under-plate 63 is held at the waiting position and is spaced a sufficient distance apart from the wafer W supported on the spin chuck 59, a sufficiently large space can be secured for the movement of the carrying arm 34 to transfer the wafer W to the spin chuck 59. After transferring the wafer W to the spin chuck 59, the carrying arm 34 is retraced from the chamber casing 43 and the unit casing 42 through the opening 46' and 47'. Then, the mechanical shutter 46 of the unit casing 42 of the substrate cleaning unit 12 and the shutter 47 of the chamber casing 43 are closed. In addition, the cup 58 is raised to surround the chuck body 61 and the wafer W.

Subsequently, the under-plate 63 is raised to the working position in the chuck body 61. As shown in FIG. 12, a gap $L_1$ of a thickness in the range of, for example, about 0.5 to about 3 mm is formed between the under-plate 63 set at the working position and the lower surface (back surface) of the wafer W supported on the spin chuck 59. The chemical liquid is supplied through the fluid passage 75 into the gap $L_1$ between the under-plate 63 and the lower surface of the wafer W. The temperature regulator 108 regulates the temperature of the chemical liquid at a predetermined temperature. The chemical liquid is exuded gradually through the fluid passage 75 into the gap $L_1$. Then, the chemical liquid spreads over the entire lower surface of the wafer W in the narrow gap $L_1$ and forms a chemical liquid film uniformly wetting the lower surface of the wafer W. After the chemical liquid film has been formed in the whole gap $L_1$, the supply of the chemical liquid through the fluid passage 75 is stopped and the lower surface of the wafer W is cleaned. The breakage of the chemical liquid film formed in the gap $L_1$ can be prevented by the surface tension of the chemical liquid. If the chemical liquid film should break, some parts of the lower surface of the wafer W cannot be wetted with the chemical liquid or bubbles form in the chemical liquid film to cause faulty cleaning. Since the chemical liquid film is formed in the narrow gap $L_1$ between the under-plate 63 and the lower surface of the wafer W, the chemical liquid film is able to retain its shape and hence faulty cleaning can be avoided. The spin chuck 59 holding the wafer W is rotated at a comparatively low speed in the range of, for example, 10 to 30 rpm that will not break the chemical liquid film. Consequently, the chemical liquid forming the chemical liquid film flows, which prevents the stagnation of the chemical liquid in the chemical liquid film and enhances cleaning efficiency. The spin chuck 59 holding the wafer W may be turned intermittently; for example, the rotation of the spin chuck 59 for a predetermined period and the standstill of the same for a predetermined period may be repeated alternately. Such intermittent rotation of the spin chuck 59 holding the wafer W facilitates the spread of the chemical liquid over the lower surface of the wafer W. Naturally, the wafer W may be kept stopped during the cleaning process. The chemical liquid does not need to be supplied after the chemical liquid film has been formed because the entire lower surface of the wafer W can be cleaned with the chemical liquid forming the chemical liquid film as long as the chemical liquid film does not break. If the chemical liquid film is going to break, the chemical liquid is supplied additionally to repair the chemical liquid film. Thus, the chemical liquid is economized to reduce the consumption of the chemical liquid. The wafer W may be rotated to make the chemical liquid forming the chemical liquid film drip from the periphery of the under-plate 63 and the chemical liquid may be continuously supplied through the fluid passage 75 into the gap $L_1$ to supply the new chemical liquid into the chemical liquid film to achieve the cleaning process satisfactorily. In such a case, it is preferable to supply the new chemical liquid slowly so that the chemical liquid may be economized.

In the meantime, the shutter 48 of the chemical liquid supply arm housing 44 is opened, the chemical liquid supply arm 50 is turned to a position above the wafer W. The chemical liquid supply arm 50 sweeps the upper surface of the wafer W supported on the spin chuck 59 at least from the center to the periphery of the wafer W and pours the chemical liquid onto the wafer W. The temperature of the chemical liquid is regulated at a predetermined temperature by the temperature regulator 108. The spin chuck 59 holding the wafer W is rotated to form a chemical liquid film uniformly over the upper surface of the wafer W. In this state, the shutter 49 is closed to keep the rinsing-and-drying arm housing 45 closed so that the rinsing-and-drying arm 53 may not be contaminated with the chemical liquid. After a chemical liquid film has been formed over the upper surface of the wafer W, the chemical liquid supply arm 50 is retracted into the chemical liquid supply arm housing 44, and the second shutter 48 is closed. The top-plate 60 is moved close to the upper surface of the wafer W such that the top-plate does not come into contact with the chemical liquid film formed over the upper surface of the wafer W. For example, a gap $L_2$ is formed between the upper surface of the wafer W held by the spin chuck 59 and the top-plate 60 located close to upper surface of the wafer W. The top-plate supplies the chemical liquid onto the wafer W to repair the chemical liquid film, when chemical liquid film is going to break. The upper surface of the wafer W is cleaned mainly with the chemical liquid having been previously supplied by the chemical liquid supply arm 50. After the chemical liquid film has been formed, further supply of the new chemical liquid is restrained to economize the chemical liquid. The wafer W may be rotated to make the chemical liquid forming the chemical liquid film drip from the periphery of the wafer W and the chemical liquid may be continuously supplied from the top-plate 60 to supply the new chemical liquid into the chemical liquid film to achieve the cleaning process satisfactorily. The evaporation of the chemical liquid forming the chemical liquid film is suppressed by the top-plate 60 covering the wafer W. The top-plate 60 may touch the chemical liquid film to ensure that the chemical liquid film is formed between the top-plate 60 and the upper surface of the wafer W.

$N_2$ gas is supplied into a space over the tip plate 60 through the $N_2$ gas supply port 86 formed in the top wall of the chamber casing 43 to produce a $N_2$ gas downflow. The $N_2$ gas filling up the space between the upper surface of the top-plate 60 and the top wall of the chamber casing 43 prevents the vapor of the chemical liquid and rising around the top-plate 60 from flowing into the space extending over the top-plate 60. Thus, the remaining of the chemical liquid in an upper region of the processing chamber 43A defined by the chamber casing 43 after the completion of the cleaning process can be avoided and water marks are hardly formable.

As shown in FIG. 11, $N_2$ gas heated at a predetermined temperature by a temperature regulator 150 may be supplied through the $N_2$ gas supply port 86 during the cleaning process. Preferably, the $N_2$ gas is hated at a temperature such that the atmosphere in the processing chamber 43A in the chamber casing 43 is substantially equal to the temperature of the processing liquid supplied onto the wafer W. It is preferable that the temperature of the $N_2$ gas is controlled so that it is equal to or slightly higher than that of the chemical liquid when the temperature of the chemical liquid is higher than the room temperature, and so that the temperature of the $N_2$ gas is equal to or slightly lower than that of the chemical liquid when the temperature of the chemical liquid is lower than the room temperature. The $N_2$ gas of the thus regulated temperature has an effect of reducing difference in the processing effect of the processing liquid between wafers, in addition to an effect of preventing the diffusion of the atmosphere of the chemical liquid. When the chemical liquid is an etchant (etching liquid), the etchant is able to etch wafers at the same etch rate. Moreover, the intra-surface uniformity of the processing effect of the chemical liquid in each wafer W can be improved.

After the completion of processing both the surfaces of the wafer W with the chemical liquid, the top-plate 60 is raised while the same is rotated. The top-plate 60 is rotated to force the chemical liquid wetting the top-plate 60 to fall off the top-plate 60. The chemical liquid thus removed from the top-plate 60 is drained through the cup drain pipe 87. After the top-plate 60 has been moved to the waiting position, the spin chuck is rotated at, for example, 2000 rpm for seconds to force the chemical liquid wetting the wafer W to fall off the wafer W. The chemical liquid thus removed from the wafer W is drained through the cup drain pipe 87. The drained chemical liquid is recovered by the chemical liquid circulation unit 100 and is reused for chemical liquid economization.

Subsequently, the shutter 48 covering the opening 48' opened, and the chemical liquid supply arm 50 is moved so as to sweep the upper surface of the wafer W supported on a spin chuck 59 from the center to the periphery of the wafer W, blowing $N_2$ gas, for example, for 10 seconds against the upper surface of the wafer W to remove drops of the chemical liquid from the wafer W. Meanwhile, $N_2$ gas is blown through the fluid passage 75 of the under-plate 63 into the gap between the under-plate 63 and the lower surface of the wafer W to expel the atmosphere of the chemical liquid from the gap. Drops of the chemical liquid can be removed from the upper and the lower surface of the wafer W by thus blowing $N_2$ gas. The chemical liquid thus removed from the wafer W is drained through the cup drain pipe 87, is recovered by the chemical liquid circulation unit 100 and is reused for chemical liquid economization.

Then, as shown in FIG. 14, the cup 58 is lowered and the chemical liquid supply arm 50 is turned again to the position above the wafer W. The chemical liquid supply arm 50 is moved radially over the wafer W and pours IPA (rec) on the upper surface of the wafer W, for example, for 10 seconds. IPA (rec) is supplied through the fluid passage 75 into the gap between the under-plate 63 and the lower surface of the wafer W, for example, for 10 seconds. The IPA (rec) dripped off the wafer W is drained through the casing drain pipe 93. Then, the chemical liquid supply arm 50 is retracted into the chemical liquid supply arm housing 44 and the shutter 48 is closed.

Subsequently, the shutter 49 closing the opening 49' of the chamber casing 43 and separating the interior of the rinsing-and-drying arm housing 45 from the processing chamber 43A is opened, and the rinsing-and-drying arm 53 is turned to a position above the wafer W. In this state, the shutter 48 is kept closed to seal the chemical liquid supply arm housing 44 in order that the wafer W and the rinsing-and-drying arm 53 are protected from contamination with an atmosphere of the chemical liquid discharged through the chemical liquid pouring nozzle 51 of the chemical liquid supply arm 50. The rinsing-and-drying arm 53 is moved so as to sweep the surface of the wafer W rotating at 1000 rpm at least from the center to the periphery of the wafer W, pouring IPA (pur) onto the upper surface of the wafer W, for example, for 1 seconds at a pouring rate of 1 liters/min. At the same time, IPA (pur) is supplied through the fluid passage 75 into the gap between the lower plate 63 and the lower surface of the wafer W, for example, for 1 s at a supply rate of 1 liters/min. the IPA (pur) dripped off the wafer W is drained through the casing drain pipe 93 and is recovered by the IPA circulation unit 112. The thus recovered IPA (rec) is reused.

Then, a rinsing process is performed. The rinsing-and-drying arm 53 is moved to sweep the upper surface of the wafer W, pouring pure water, for example, for 2 seconds at a pouring rate of 1 liters/min. The wafer W is rotated at a high rotating speed, for example, in the range of about 500 to about 1000 rpm higher than that at which the wafer W is rotated during the chemical liquid treatment. Pure water poured onto the wafer W rotating at a high rotating speed can be uniformly spread over the entire upper surface of the wafer W. Pure water is supplied, for example, for 2 seconds at a supply rate of 1 liters/min through the fluid passage 74 into the gap $L_1$ between the under-plate 63 and the lower surface of the wafer W, while the under-plate 63 is held at the working position. Since the wafer W is rotating at a high rotating speed, the pure water supplied into the gap $L_1$ spreads uniformly over the entire lower surface of the wafer W. In this state the under-plate 63 can be cleaned as well as the wafer W. Both the surfaces of the wafer W are thus rinsed to wash off the chemical liquid from the wafer W. The pure water used for rinsing the wafer W is drained through the casing drain pipe 93. If the quality of the chemical liquid permits, the foregoing rinsing process using pure water may be omitted. After the completion of the rinsing process, a drying process is performed, in which the wafer W is rotated at a high rotating speed of, for example, 1500 rpm higher than that at which the wafer W is rotated in the rinsing process to spin-dry the wafer W. While the wafer W is thus rotated at a high rotating speed, $N_2$ gas is spouted onto the upper surface of the wafer W by the rinsing-and-drying arm 53, and $N_2$ gas is spouted through the fluid passage 75 on the lower surface of the wafer W. Thus, the under-plate 63 is dried as well as both the surfaces of the wafer W.

After the completion of the drying process, the rinsing-and-drying arm 53 is retracted into the rinsing-and-drying arm housing 45 and the shutter 49 is closed. Then, the wafer W is carried out of the substrate cleaning unit 12. The mechanical shutter 46 closing the opening 46' of the unit casing 42 and the shutter closing the opening 47' of the chamber casing 43 are opened. Then, the main wafer-carrying mechanism 18 advances the carrying arm 34 into the chamber casing 43 to support the wafer W on the carrying arm 34. Then, the carrying arm 34 is raised to receive the wafer W from the support pins of the spin chuck 59, and carries the wafer W out of the substrate-cleaning unit 12. Since the under-plate 63 is located at the waiting position while the main carrying mechanism 18 carries the wafer W out of the substrate-cleaning unit 12, a sufficiently wide gap is formed between the under-plate 63 and the wafer W supported on the spin chuck 59, and hence the wafer W can be smoothly transferred from the spin chuck 59 to the carrying arm 34.

When necessary, the chemical liquid supply arm 50 is cleaned by the chemical liquid supply arm cleaning device 56 while the chemical liquid supply arm 50 is housed in the chemical liquid supply arm housing 44. For example, the chemical liquid supply arm 50 is retracted into the chemical liquid supply arm housing 44 after the completion of pouring IPA (rec) on the wafer W, and then the shutter 48 is closed. Then, the chemical liquid supply arm 50 is moved to a predetermined position, and is cleaned by the chemical liquid supply arm cleaning device 56. During a cleaning process for cleaning the chemical liquid supply arm 50, the shutter 48 is kept closed to seal the chemical liquid supply arm housing 44 so that an atmosphere of the cleaning liquid may not leak into the interior space of the unit casing 42 and the processing chamber 43A of the chamber casing 43. Therefore, even if the wafer W is placed in the processing chamber 43A, the chemical liquid supply arm 50 can be cleaned. The throughput of the substrate cleaning unit 12 can be increased by cleaning the chemical liquid supply arm 50, for example, during the rinsing process. The rinsing-and-drying arm 53 housed in the rinsing-and-drying arm housing 45 can be cleaned by the rinsing-and-drying arm cleaning device 57 in the rinsing-and-drying arm housing 45 to clean the rinsing-and-drying arm 53 when necessary. For example, the rinsing-and-drying arm 53 is retracted into the rinsing-and-drying arm housing 45 after the completion of spouting of $N_2$ gas on the wafer W, the shutter 49 is closed, the rinsing-and-drying arm 53 is located at a predetermined position, and the rinsing-and-drying arm 53 is cleaned by the rinsing-and-drying arm cleaning device 57. While the rinsing-and-drying arm 53 is being cleaned, the shutter 49 is kept closed to seal the rinsing-and-drying arm housing 45 so that an atmosphere of a cleaning liquid may not leak into the interior of the unit casing 42 and the processing chamber 43A of the chamber casing 43. Therefore, even if the wafer W is placed in the processing chamber 43A, the rinsing-and-drying arm 53 can be cleaned. The throughput of the substrate cleaning unit 12 can be increased by cleaning the rinsing-and-drying arm 53, for example, during the cleaning process.

In the substrate cleaning unit 12, the shutters 48 and 49 isolate the spaces in which the chemical liquid supply arm 50 and the rinsing-and-drying arm 53 are housed from the atmosphere in the processing chamber 43A of the chamber casing 43. Accordingly, the processed wafer W is not affected by the atmospheres of liquids that may drip from the nozzles of the chemical liquid supply arm 50 and the rinsing-and-drying arm 53 while the chemical liquid supply arm 50 and the rinsing-and-drying arm 53 are kept at the waiting positions, respectively. The processed wafer W is not also affected by the atmosphere of the cleaning liquid for cleaning the chemical liquid supply arm 50 and the rinsing-and-drying arm 53 at their waiting positions. Moreover, the rinsing-an-drying arm 53 will not be contaminated with the atmosphere of the chemical liquid that may drip from the chemical liquid supply arm 50 at the waiting position or the atmosphere of the chemical liquid produced while processing the wafer W.

Figure 15:
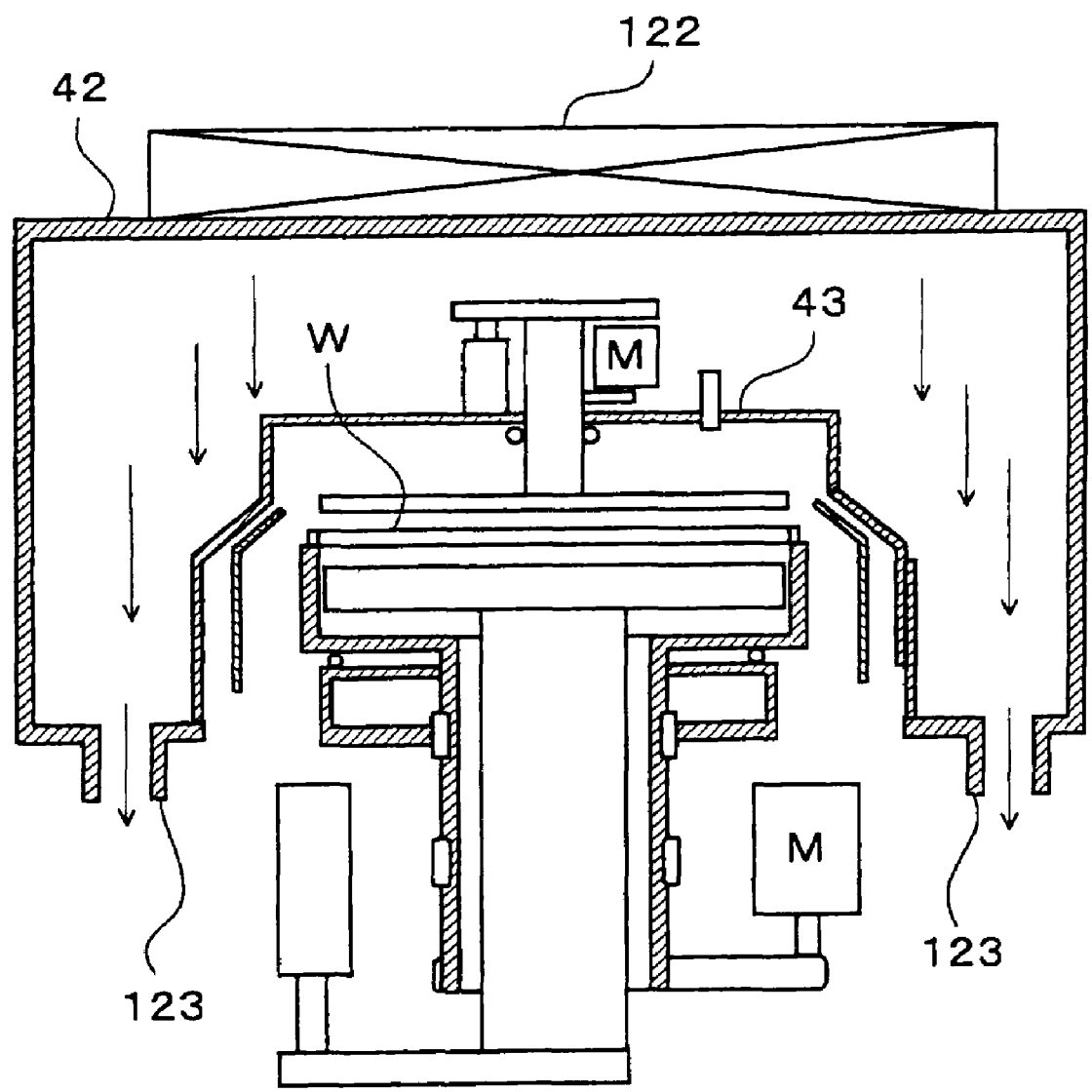
FIG. 15 is a longitudinal sectional view of assistance in explaining a substrate-cleaning unit in a preferred embodiment according to the present invention provided with a fan-and-filter unit (FFU) and an exhaust system.

Although the preferred embodiment of the present invention has been described, the present invention is not limited thereto in its practical application. For example, a FFU 122 may be disposed in an upper region of the interior of the unit casing 42, and an exhaust mechanism 123 may be incorporated into a lower part of the unit casing 42 as shown in FIG. 15. If the atmosphere of the processing liquid leaks from the processing chamber 43A, the leaked atmosphere of the processing liquid flows down together with a downflow produced by the FFU 122 and is discharged from the unit casing 42 by the exhaust mechanism 123. Thus, the possibility that the processed wafer W is contaminated with the atmosphere of the processing liquid when carrying the processed wafer W out of the unit casing 42 is reduced, and the atmosphere of the processing liquid is hardly able to leak from the unit casing 42. The chemical liquid supply arm housing 44 and the rinsing-and-drying arm housing 45 may be provided with exhaust mechanism, respectively.

A plurality of deflectors 130 may be attached to the inner surface of the side wall of the chamber casing 43 as shown in FIGS. 16 and 17. Air currents that flow toward the side wall of the chamber casing 43 are generated when the spin chuck 59 or the top-plate 60 rotates. The plurality of deflectors 130 guide the air currents downward and, consequently, the processing liquid or the atmosphere of the processing liquid are able to flow smoothly downward. Similarly, a plurality of deflectors 131 may be attached to the inner surface of the side wall of the cup 58. The plurality of deflectors 131 guide the air currents downward and, consequently, the processing liquid or the atmosphere of the processing liquid are able to flow smoothly downward.

As shown in FIG. 18, the under-plate shaft 67 connected to the under-plate 63 may be provided with a fluid passage 140 for supplying a chemical liquid, IPA and $N_2$ gas in its central part, and with fluid passages 141 for supplying IPA, pure water and $N_2$ gas in its central and parts around the central part. As shown in FIG. 19, a discharge port 142 for discharging a chemical liquid, IPA and $N_2$ gas may be formed in a central part of the under-plate 63, and discharge ports 143$a$, 143$b$ and 143$c$ for discharging IPA, pure water and $N_2$ gas may be formed in a central part, in parts at a radial distance equal to ⅓ of the radius of the under-plate 63 from the center of the under-plate 63 and in parts at a radial distance equal to ⅔ of the radius of the under-plate 63 from the center of the under-plate 63, respectively, in a properly distributed arrangement. Timing of discharging fluids through the discharge ports 143$a$, 153$b$ and 143$c$ may be controlled to discharge the chemical liquid or pure water, IPA or $N_2$ gas can be gradually discharged through the discharge ports 143$a$, 143$b$ and 143$c$ at different times, respectively. For example, when pure water is discharged through the discharge ports 143$a$, 143 band 143$c$, pure water discharged through the central discharge port 143$a$ urges pure water discharged through the four discharge ports 143$b$ arranged on a circle of a radius equal to ⅓ of the radius of the under-plate 63 to flow toward the periphery of the wafer W, and pure water discharged through the discharge ports 143$b$ urges pure water discharged through the four discharge ports 143$c$ arranged on a circle of a radius equal to ⅔ of the radius of the under-plate 63 to flow toward the periphery of the wafer W. Thus, the pure water discharged through the radially outer discharge ports can be urged to flow toward the periphery of the wafer S by the pure water discharged by the radially inner discharge ports. Therefore, the pure water can be forced to flow efficiently with the wafer W kept stationary, and hence the cleaning effect of the pure water is similar to that of the pure water available when the wafer W is rotated. When the wafer W is rotated, the pure water can be more efficiently force to flow for a cleaning effect similar to that available when the wafer W is rotated at a higher rotating speed. Thus, the use of the under-plate 63 provided with those discharge ports 143$a$, 143$b$ and 143$c$ is suitable for processing a wafer by a process in which the wafer W cannot be rotated at a high rotating speed.

When discharging $N_2$ gas through the discharge ports 143$a$, 143$b$ and 143$c$, $N_2$ gas is discharged first through the central discharge port 143$a$ to dry a central part of the surface of the wafer W. After a drying process using the $N_2$ gas discharged through the central discharge port 143$a$ has been completed, a drying process in which $N_2$ gas is discharged through the discharge ports 143$b$ on the circle of the radius equal to ⅓ of the radius of the under-plate 63 is started. When the discharge of $N_2$ gas through the discharge ports 143$b$ is started after a drying process for drying a central region of the surface of the wafer W inside the circle on which the discharge port 143$b$ are arranged has been completed, liquid drops adhering to a region of the surface of the wafer W outside the circle on which the discharge port 143$b$ are arranged do not flow to the dried central region of the surface of the wafer W, and hence the drying process can be efficiently carried out. When the discharge of $N_2$ gas through the discharge ports 143$c$ is started after the drying process using $N_2$ gas discharged through the discharge port 143$b$ has been completed, liquid drops adhering to a region of the surface of the wafer W outside the circle on which the discharge port 143$c$ are arranged do not flow to the dried region of the surface of the wafer W dried by the $N_2$ gas discharged through the discharge ports 143$a$ and 143$b$, and hence the drying process can be efficiently carried out. Thus, the cleaning process can be efficiently carried out with the wafer W kept stationary, and hence the drying effect of the drying process is similar to that available when the wafer W is rotated. Thus, the use of the under-plate 63 provided with those discharge ports 143$a$, 143$b$ and 143$c$ is suitable for drying a wafer by a process in which the wafer W cannot be rotated at a high rotating speed.

When a liquid, such as IPA or pure water, or a gas, such as $N_2$ gas is discharged through the discharge ports 143$a$, 143$b$ and 143$c$ formed in the under-plate 63 as shown in FIG. 19, the area of a region allocated to the radially outer discharge port is larger than that allocated to the radially inner discharge port. Therefore, the discharge rate or the discharge pressure at which the fluid to be discharged through the radially outer discharge port may be higher than that of the fluid to be discharged through the radially inner discharge port. Discharge rates and/or discharge pressures at which the fluid is discharge through the discharge ports 143$a$, 143$b$ and 143$c$ may be increased in order of the discharge ports 143$a$, 153$b$ and 143$c$, which enables efficient, uniform processing of the wafer W. In addition to or instead of discharging the fluid at such discharge rate and/or discharge pressures, the number of the discharge ports far from the center of the under-plate 63 may be increased. For example, eight discharge ports 143$c$ may be formed instead of the four discharge ports 143$c$ shown in FIG. 19.

The present invention is not limited to the substrate cleaning apparatus that uses a cleaning liquid; the present invention is applicable to substrate processing apparatus that process substrates by processes that use various processing liquids other than cleaning processes. The substrates are not limited to semiconductor wafers and may be glass plates for LCDs, printed wiring boards and ceramic substrates.

In the foregoing embodiment, the space where the processing fluid supply arm is held at the waiting position and the space where the substrate is processed can be isolated from each other. Even if an atmosphere of the processing liquid or a processing gas is discharged from the processing fluid supply arm, the atmosphere of the processing liquid or the processing gas does not contaminate the other processing liquid supply arms stored in the processing liquid supply means housing unit. A processing liquid of a high cleanliness can be supplied onto a substrate by cleaning the processing liquid supply arm. The exertion of an influence on a substrate placed in the processing chamber by the atmosphere of the cleaning liquid for cleaning the processing liquid supply arm can be prevented and a processing liquid of a high cleanliness can be always supplied onto a substrate.

Since the substrate-processing system has a double-casing structure and a substrate is processed in the processing chamber defined by the chamber casing, even if an atmosphere of the processing liquid leaks from the chamber casing, the leakage of the atmosphere of the processing liquid from the substrate-processing system can be prevented by discharging the atmosphere of the processing liquid from the unit casing. When wetting the upper surface of a substrate with the processing liquid, the top-plate extending over the substrate so as to cover the substrate prevents the evaporation of the processing liquid forming a processing liquid film on the upper surface of the substrate. The flow of atmosphere of the processing liquid into a space extending over the top-plate can be prevented by filling the space extending over the top-plate with an inert gas. When the substrate is subjected successively to different processes, it is possible to avoid the remaining of the processing atmosphere of the preceding process around the substrate at the start of the succeeding process by carrying out the preceding process in the space surrounded by the cup, and lowering the cup before starting the succeeding process.

What is claimed is:

1. A substrate processing apparatus comprising:
   a substrate support member that supports a substrate arranged in a processing space;
   a first processing fluid supply unit including a first nozzle for supplying a first processing fluid onto a substrate supported by the substrate support member, and a first arm holding the first nozzle;
   a second processing fluid supply unit including a second nozzle for supplying a second processing fluid onto a substrate supported by the substrate support member, and a second arm holding the second nozzle;
   a first housing defining a first room adapted to accommodate the first processing fluid supply unit;
   a second housing defining a second room adapted to accommodate the second processing fluid supply unit;
   a first shutter disposed between the processing space and the first room, the first shutter being configured to open to allow the first nozzle held by the first arm to move into the processing space, and confirmed to close to separate the first room accommodating the first processing fluid supply unit from the processing space; and
   a second shutter disposed between the processing space and the second room, the second shutter being configured to open to allow the second nozzle held by the second arm to move into the processing space, and configured to close to separate the second room accommodating the second processing fluid supply unit from the processing space.

2. The apparatus according to claim 1 further comprising an enclosure structure defining the processing space in which the substrate support member is arranged.

3. The apparatus according to claim 1 further comprising;
   a first cleaning unit disposed in the first room to clean the first processing fluid supply unit; and
   a second cleaning unit disposed in the second room to clean the second processing fluid supply unit.

4. The apparatus according to claim 1, wherein the first processing fluid supply unit is configured to supply a chemical liquid, and the second processing fluid supply unit is configured to supply a rinse liquid.

* * * * *